US006552908B2

(12) United States Patent
DeNardis

(10) Patent No.: US 6,552,908 B2
(45) Date of Patent: Apr. 22, 2003

(54) VEHICULAR MODULAR DESIGN MULTIPLE APPLICATION RECTIFIER ASSEMBLY HAVING OUTER LEAD INTEGUMENT

(75) Inventor: Nicholas DeNardis, Marshfield, WI (US)

(73) Assignee: Transpo Electronics, Inc., Orlando, FL (US)

(*) Notice: Subject to any disclaimer, the term of this patent is extended or adjusted under 35 U.S.C. 154(b) by 0 days.

(21) Appl. No.: 10/078,258

(22) Filed: Feb. 19, 2002

(65) Prior Publication Data
US 2002/0136041 A1 Sep. 26, 2002

Related U.S. Application Data
(60) Provisional application No. 60/270,386, filed on Feb. 21, 2001.

(51) Int. Cl.$^7$ ................................................ H05K 7/20
(52) U.S. Cl. .................. 361/709; 361/707; 165/80.2; 165/185; 363/141; 310/68 D
(58) Field of Search ................... 361/704, 705, 361/707, 708–710; 165/80.3, 185; 363/141; 310/68 D

(56) References Cited

U.S. PATENT DOCUMENTS

| | | | | |
|---|---|---|---|---|
| 3,602,793 A | | 8/1971 | Grozinger | 320/8 C |
| 3,604,963 A | | 9/1971 | Tawara | 310/68 |
| 3,629,631 A | | 12/1971 | Cotton et al. | 310/68 D |
| 3,777,193 A | | 12/1973 | Buehner | 310/68 D |
| 3,831,062 A | | 8/1974 | Haug et al. | 317/100 |
| 3,927,338 A | | 12/1975 | Vieilleribiere | 310/68 D |
| 4,161,775 A | | 7/1979 | Franz et al. | 363/145 |
| 4,169,282 A | | 9/1979 | Allport et al. | 363/145 |
| 4,419,597 A | | 12/1983 | Shiga et al. | 310/68 D |
| 4,604,538 A | | 8/1986 | Merrill et al. | 310/68 D |
| 4,701,828 A | * | 10/1987 | Weiner | 361/692 |
| 4,952,829 A | | 8/1990 | Armbruster et al. | 310/68 D |
| 5,043,614 A | | 8/1991 | Yockey | 310/68 D |
| 5,331,231 A | | 7/1994 | Koplin et al. | 310/68 D |
| 5,451,823 A | | 9/1995 | Deverall et al. | 310/68 D |
| 5,640,062 A | | 6/1997 | Yockey | 310/68 D |
| 5,652,471 A | | 7/1997 | Mayer et al. | 310/68 D |
| 5,682,070 A | | 10/1997 | Adachi et al. | 310/71 |
| 5,712,517 A | | 1/1998 | Schmidt et al. | 310/45 |
| 5,838,544 A | * | 11/1998 | Wei | 361/704 |
| 5,883,450 A | | 3/1999 | Abadia et al. | 310/68 D |
| 5,886,963 A | | 3/1999 | Abe et al. | 369/44.35 |
| 5,991,184 A | | 11/1999 | Russell et al. | 363/145 |
| 6,198,188 B1 | | 3/2001 | Ihata | 310/68 D |
| 6,204,581 B1 | * | 3/2001 | Lo | 310/68 D |
| 6,205,024 B1 | * | 3/2001 | Shih et al. | 361/704 |
| 6,307,289 B1 | * | 10/2001 | Skala | 310/68 D |
| 6,476,527 B2 | * | 11/2002 | Ballard et al. | 310/68 D |

FOREIGN PATENT DOCUMENTS

| | | | | |
|---|---|---|---|---|
| DE | 39 30 158 A1 | 3/1991 | | H02K/11/00 |
| EP | 0 822 642 A1 | 2/1998 | | H02K/11/04 |
| EP | 0 969 583 A1 | 10/2000 | | H02K/11/04 |

* cited by examiner

Primary Examiner—Boris Chervinsky
(74) Attorney, Agent, or Firm—Allen, Dyer, Doppelt, Milbrath & Gilchrist, P.A.

(57) ABSTRACT

A rectifier assembly includes two substantially identical and interchangeable heat sink plates mounted parallel to each other in spaced relation. Each heat sink plate has a plurality of identically positioned diode mounting holes. A plurality of rectifier diodes are mounted within the diode mounting holes such that plates are selectively negative or positive depending on the plurality of diodes mounted within the plate. A lead integument formed from an insulator material is mounted on a heat sink plate opposing the other heat sink plate and has embedded conductors and connectors that interconnect diode electrodes and other rectifier components.

18 Claims, 22 Drawing Sheets

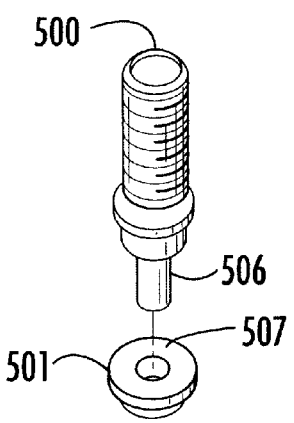
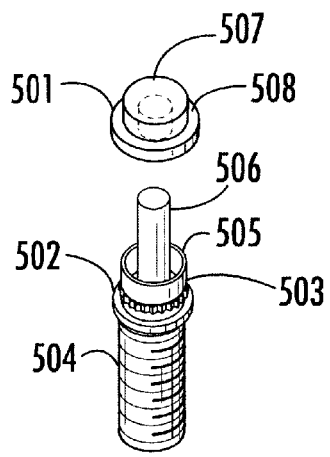
FIG. 9a.   FIG. 9b.
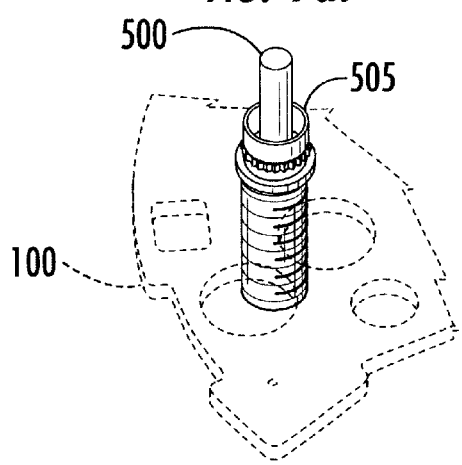
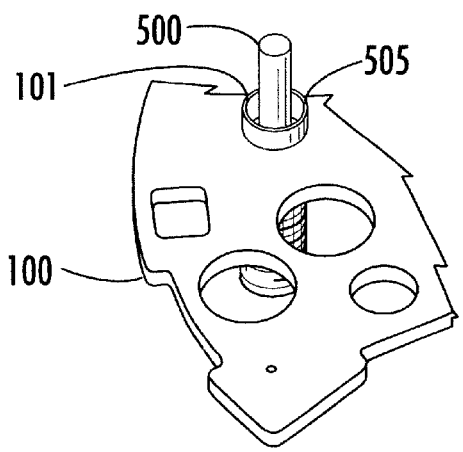
FIG. 9c.   FIG. 9d.
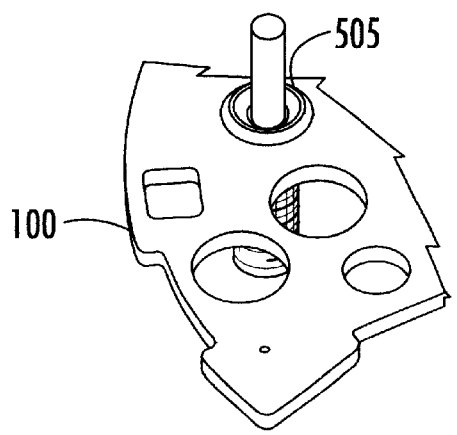
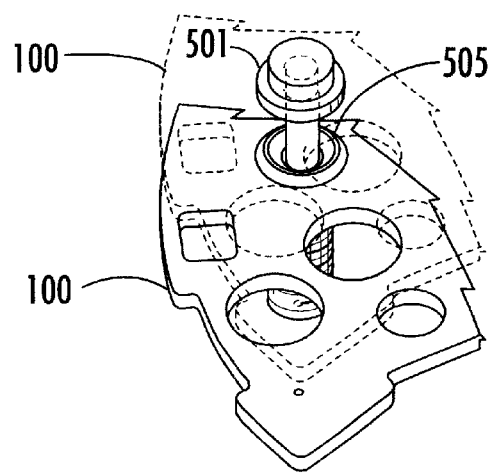
FIG. 9e.   FIG. 9f.

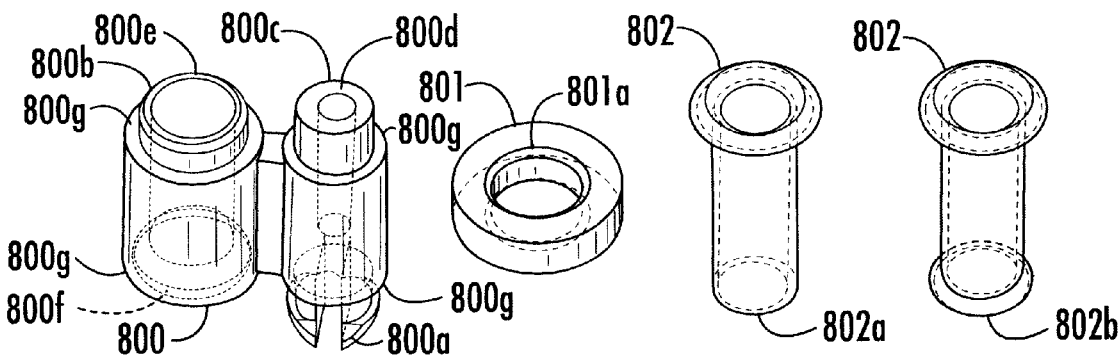
FIG. 13a. FIG. 13b. FIG. 13c. FIG. 13d.
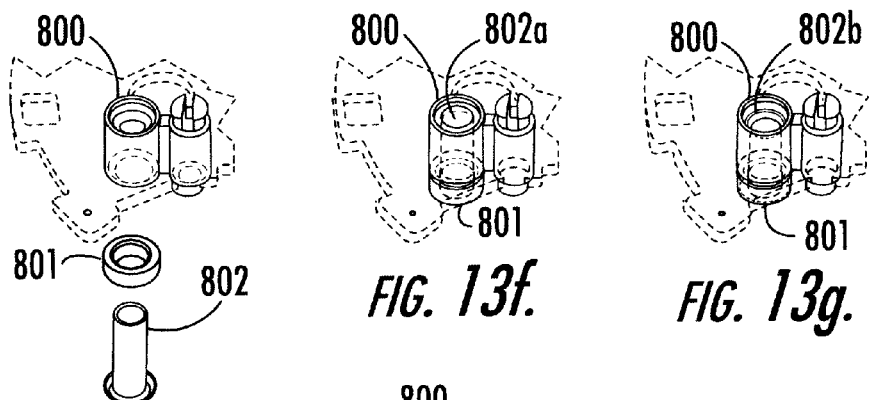
FIG. 13f. FIG. 13g.
FIG. 13e.
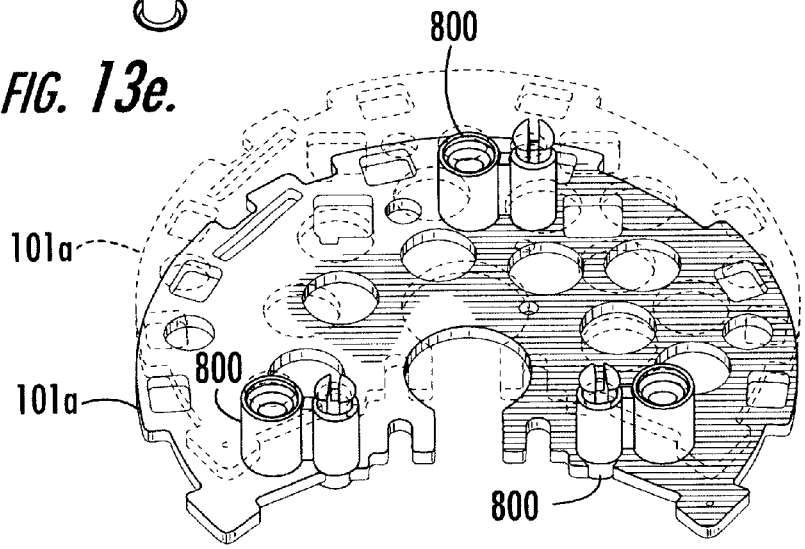
FIG. 13h.

VEHICULAR MODULAR DESIGN MULTIPLE APPLICATION RECTIFIER ASSEMBLY HAVING OUTER LEAD INTEGUMENT

RELATED APPLICATION

This application is based upon prior filed copending provisional application Ser. No. 60/270,386 filed Feb. 21, 2001.

FIELD OF THE INVENTION

This invention relates to rectifier assemblies, and more particularly, this invention relates to rectifier assemblies used with engine-driven alternating current generators and methods of constructing same.

BACKGROUND OF THE INVENTION

Engine-driven alternating current generators require rectifier assemblies for rectifying alternating current into a direct current suitable for use with automotive electronic components. Typically, automotive rectifier assemblies use heat sink plates that include press fit diodes.

Examples of rectifier assemblies as described include those rectifier assemblies disclosed in commonly assigned U.S. Pat. No. 5,451,823, issued Sep. 19, 1995, and U.S. Pat. No. 5,991,184, issued Nov. 23, 1999, the disclosures which are hereby incorporated by reference in their entirety.

Some of the prior art rectifiers, however, do not have adequate diode electrode clearance, efficient diode positioning, and adequate ventilation for cooling the diodes.

U.S. Pat. No. 4,952,829, Armbruster et. al. discloses a single insulator, conductor embedded integument that is positioned between two heat sinks formed as electrically conductive plates that can correspond to negative and positive heat sinks that receive respective negative and positive diodes. The integument encloses embedded conductor leads for interconnecting the diodes, stator leads, and other components used in these rectifier assemblies. This type of integument typically includes a single circuit board. The single integument interconnects seventeen diodes and six stator leads of an alternator stator, corresponding typically to the non-rotating part of the structure. The complexity of these single integuments with embedded conductors sometimes requires the formation of multilayer conductors that are electrowelded to form a desired circuit configuration. If an electroweld is weak or improperly fabricated, it is not possible to perform a visual inspection after the conductors are embedded.

This relatively large, single integument also restricts the air flow between the outer and inner conductive plates. Because rectifier diodes are located near the end of these plates, the diodes are not sufficiently cooled and are prone to failure. Furthermore, each different alternator application requires an expensive mold to manufacture a single circuit board for the integument, resulting in a large inventory of parts. Furthermore, as new alternator applications develop, a single integument as described requires extensive design and tooling changes, even with simple design changes. Also, a single conductor embedded integument restricts equalized heat dissipation because it is not symmetrically formed.

In U.S. Pat. No. 5,331,231, Koplin et. al., a threaded bolt is used as an output terminal and positioned between two rectifier plates. This bolt is mounted from the inner side of an outer rectifier plate and held in position by a common, threaded nut on the outer side of the rectifier plate. The threaded bolt is placed between two conductor plates, which receive press fitted rectifier diodes. These plates are electrowelded to opposite sides of the single integument, making the removal and replacement of the threaded bolt impractical. No particular advantage has been gained by securing the bolt with a common nut, which is also subject to loosening by vibration. The additional production step required for assembly of this rectifier is not advantageous.

SUMMARY OF THE INVENTION

In accordance with the present invention, a rectifier assembly and method of forming same is disclosed, which can be used on a variety of applications of various output current capacities and external connectors by using a small number of universal and specially designed components that minimize tooling costs and reduces the inventory of single application components, which may have a questionable usage rate. The present invention also improves the performance of single application type components by increasing the speed of assembly, and allowing a robust and sturdy rectifier assembly construction that can withstand severe vibration and extreme temperature variations, and have an extended thermal cycling life and corrosion protection. Each rectifier assembly can be used specifically for an intended application.

The rectifier assembly of the present invention includes opposing, substantially identical heat sink plates that are interchangeable as either positive or negative heat sinks. Three identical standoffs with snap in wedges are located at key mounting areas. Three identical stator guides "snap in" for an interconnection between the stator lead and diode anode leads. Three identical center tap guides that "snap in" use the tabs. It is possible to electroweld a preformed semicircular conductor ring and other preformed conductors if center tapped diode connections are required. A trio diode mount connects smaller preformed diodes to stator leads. A stud, spade, threaded, or side connector allows external interconnects in any combination for a required specific application.

A rectifier assembly includes two substantially identical and interchangeable heat sink plates mounted parallel to each other in spaced relation. Each heat sink plate has a plurality of identically positioned diode mounting holes. A plurality of rectifier diodes are mounted within the diode mounting holes such that plates are selectively negative or positive depending on the plurality of diodes mounted within the plate. A lead integument formed from an insulator material is mounted on a heat sink plate opposing the other heat sink plate and has embedded conductors and connectors that interconnect diode electrodes and other rectifier components.

BRIEF DESCRIPTION OF THE DRAWINGS

Other objects, features and advantages of the present invention will become apparent from the detailed description of the invention which follows, when considered in light of the accompanying drawings in which:

FIG. 9A is an isometric view of the threaded bolt and insulated shoulder washer used in the present invention.

FIG. 9B is an isometric view of the threaded bolt and insulated shoulder washer shown rotated 180 degrees from the view shown in FIG. 9A.

FIG. 9C is an isometric view of the threaded bolt pressed into the heat sink plate as shown in phantom lines.

FIG. 9D is an isometric view of the threaded bolt pressed into the heat sink plate before the crimping operation.

FIG. 9E is an isometric view of the threaded bolt pressed into the heat sink plate after the crimping operation.

FIG. 9F is an isometric view of the threaded bolt pressed into the heat sink plate after the crimping operation, and showing the negative heat sink plate in phantom lines and showing placement of the shoulder washer.

FIG. 13A is an isometric view of the standoff.

FIG. 13B is an isometric view of the insulated washer.

FIG. 13C is an isometric view of the eyelet shown before the crimping operation.

FIG. 13D is an isometric view of the eyelet shown after the crimping operation.

FIG. 13E is an exploded, isometric view of the eyelet, washer, and standoff.

FIG. 13F is an isometric view of the eyelet, washer, and standoff in assembled form before the crimping operation.

FIG. 13G is an isometric view of the eyelet, washer, and standoff in assembled form after the crimping operation.

FIG. 13H is an isometric view of the eyelet, washer, and standoff in assembled form and mounted on a heat sink plate and showing the other, identical heat sink plate in phantom and snapped into position over three identical standoff assemblies.

FIG. 18 is an exploded isometric view showing separated heat sink plates and relative positioning of positive and negative diodes that face the same direction.

FIG. 19 is an isometric view of the positive heat sink and showing diodes mounted therein.

FIG. 20 is an isometric view of the negative heat sink and showing diodes mounted therein.

FIG. 21 is an isometric view of the lead integument.

FIG. 22 is an isometric view of the negative and positive heat sink plates secured together.

FIG. 23 is another isometric view of the lead integument of another embodiment that has the side vehicle connector mounted thereto.

FIG. 24 is an isometric view of the positive and negative heat sink plates connected together for use with the lead integument shown in FIG. 23.

FIG. 25 is an isometric view of the assembled rectifier assembly shown in FIGS. 21 and 22.

FIG. 26 is an isometric view of the assembled rectifier assembly shown in FIGS. 23 and 24.

FIG. 27 is another isometric view of the assembled rectifier assembly shown in FIG. 25 and showing various components and phantom lines to show the conductors.

FIG. 28 is an isometric view of the lead integument without various conductors mounted therein.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention allows for the construction of rectifier assemblies for engine-driven alternating current generators where a family of different capacity rectifier assemblies can be used, each having variations in the heat sink plate area. Internal connectors are common and the physical nature of various subcomponents used in the rectifier assembly are similar. In the present invention, two identical metallic semicircular plates are used as heat sink plates and can be either positive or negative rectifier heat sink plates as dependent on the polarity of the press fit diode electrodes in press fitted specific hole locations. The advantage of such a structure and method is a reduced tooling cost and increase in production volume, as opposed to using two dissimilar plates dedicated to each function. The rectifier assembly design of the present invention permits a cross airflow for maximum cooling. Any holes without press fit diodes serve a dual function and permit electrode clearance and rapid electrowelding of the electrode and of the diodes to a predetermined shape of conductor embedded integument. All diode specific holes can serve to contain a diode or provide for electrode clearance and ventilation. Therefore, all holes provide a useful function and are not stamped merely for the sake of having a common plate for both positive and negative diode functions.

Any stator guides, center tap guides, trio diode mount, standoffs, side connector, stud terminal and spade terminal are fabricated to snap fit into the plates for rapid assembly and electrowelding to respective termination points. Therefore, the components are made to minimize any restriction to air flow. This is an important consideration because the only air path exists from the outer plate, through the components, through the inner plate, through the generator and housing and through the rotor-driven fan.

In another aspect of the present invention, the plates are mounted together and an integument acting as an outer lead frame is placed to the outside of the heat sink plates as shown in FIGS. 18–28. A threaded bolt can be used in a manner that is press fit into the outer side of an outer plate and crimped or riveted on the inner side of the plate with a shaft extension fitted into an insulated washer to fit in the corresponding hole of the inner plate for radial stability.

Figure 1A:
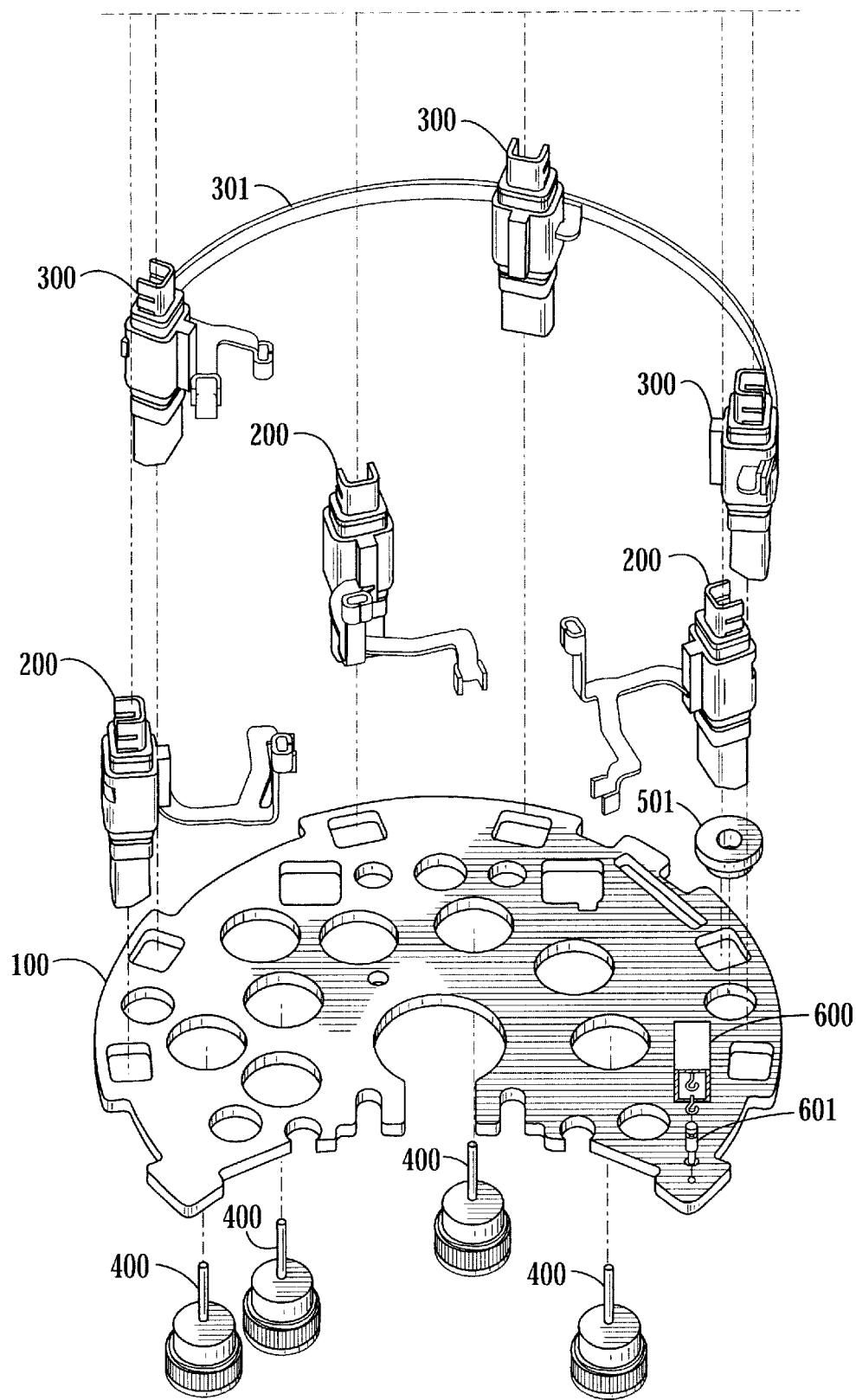
FIG. 1A is an exploded, isometric view of the negative heat sink and associated components in a first embodiment of the rectifier assembly of the present invention.
Figure 1B:
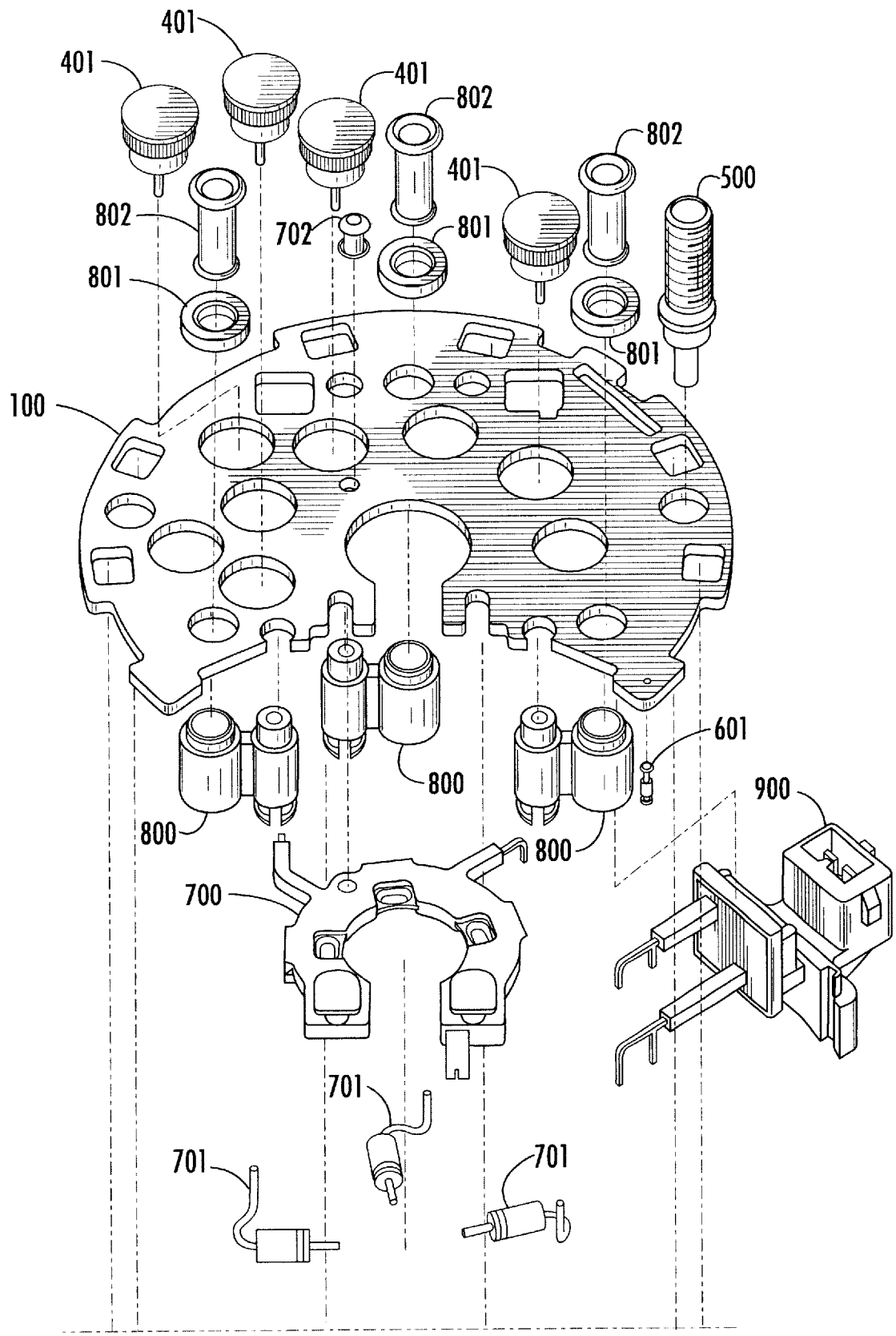
FIG. 1B is an exploded, isometric view of positive heat sink and associated components of a first embodiment of the rectifier assembly using a side connector.

FIGS. 1A and 1B show components forming the rectifier assembly of one embodiment of this invention. Each of the components are rotated 45° toward the viewer from a plane projected at the eye level of the viewer. FIG. 1A illustrates the following major components or component groups: a negative (or lower) heat sink plate 100; stator lead guide 200; center tap guide assembly 300; press fit type rectifier diodes 400; a threaded bolt insulated washer 501; a filter capacitor 600; and filter capacitor connector standoff 601.

FIG. 1B illustrates a first embodiment of the present invention operative with the negative heat sink plate 100 and illustrates the following components, or component groups: positive heat sink plate 100; rectifier diodes 401; threaded output terminal 500; filter connector standoff 601; trio diode mount 700; trio or field excitation diodes 701; trio mount eyelet 702; standoff supports 800; eyelet insulators 802; securing eyelets 802; and side vehicle connector 900.

Figure 1C:
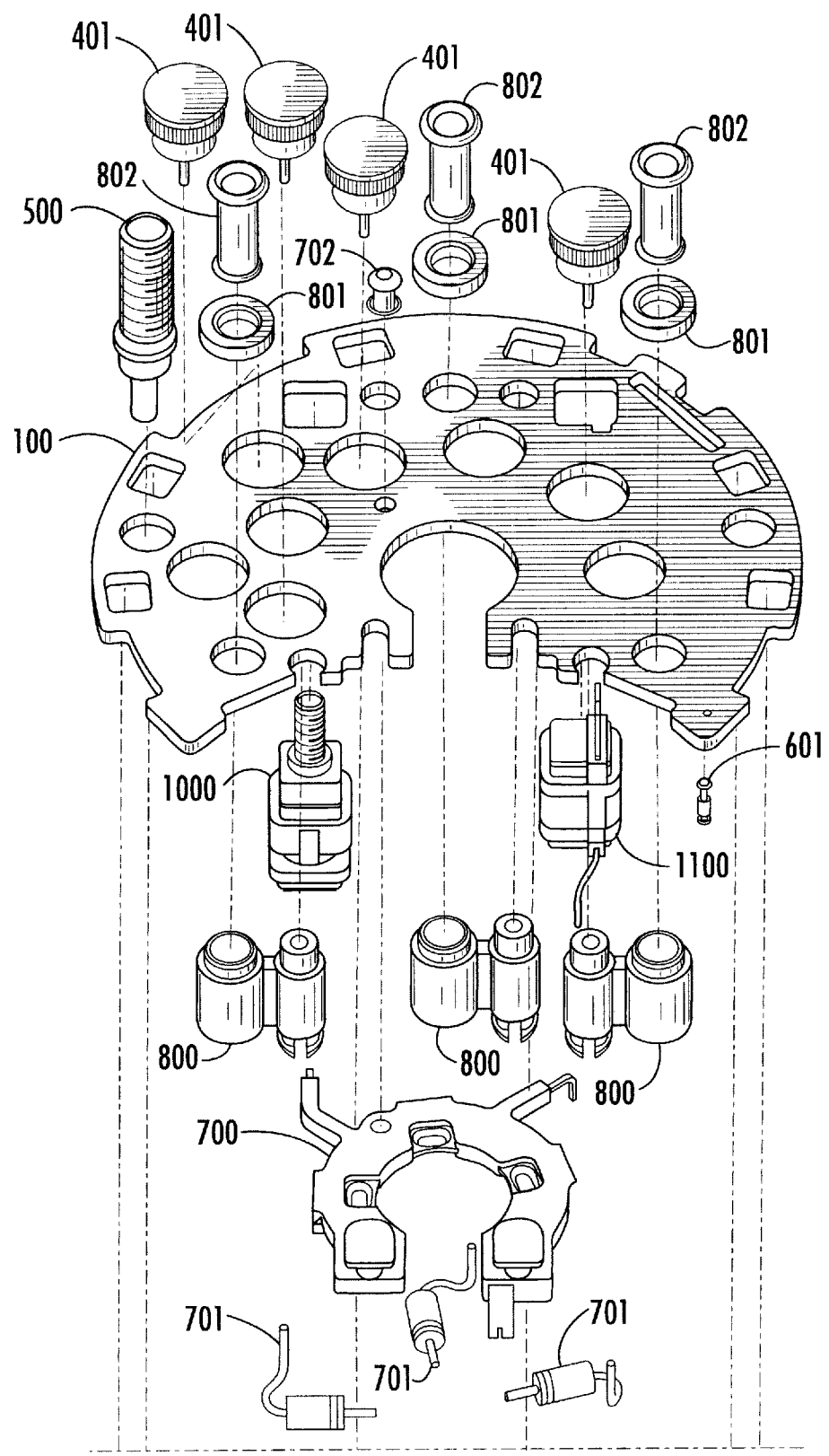
FIG. 1C is an exploded, isometric view of a positive heat sink and associated components of a second embodiment that is used with the negative heat sink of FIG. 1A and showing use of stud and spade connectors.

FIG. 1C illustrates a second embodiment of the present invention and operative with the components and heat sink plate shown in FIG. 1A and showing the following components, or component groups where similar functional components have the same reference numerals as identified above: positive heat sink plate 100; rectifier diodes 401; threaded output terminal 500; filter connector standoff 601; trio diode mount 700; trio or field excitation diodes 701; trio mount eyelet 702; standoff supports 800; eyelet insulators 802; securing eyelets 802; trio diode output stud 1000: and stator output spade terminal 1100.

Referring once again to FIG. 1B, the order of assembly for the rectifier assembly is now described. The positive heat sink plate 100 is formed of either aluminum or copper material. Rectifier diodes 401 are press fit into their respective holes, as indicated by the center lines. Threaded output terminal 500 is formed of a typically metallic material and is both pressed and riveted via its own machined lip into its respective hole in plate 100. Filter capacitor connector standoff is made of metallic, conductive material and is both press fitted and riveted into its respective hole in plate 100. Standoffs 800 can be made from plastic or other insulator material and are snapped into their respective holes into plate 100 as denoted by the center lines from underneath.

Eyelets 802 can be made from a metallic material and are shown with the insert end after the rivet operation. The eyelets 802 are pushed through an insulating washer 801 and through the receiving hole in the standoff 800, where the riveting operation is accomplished for each of the three identical standoffs 800. Preformed, axial lead diodes 701 are snapped into preformed slots (not shown in FIG. 1B) in trio mount 700 and electrowelded to the respective, embedded conductor pads. The mounting extrusions of the trio mount slide into the receiving slots of plate 100 and are secured with an eyelet 702 as shown after riveting operation. The connector 900 is snapped into its respective hole in plate 100 and the mating conductors relative to the mount 700 are electrowelded.

Referring to FIG. 1A the three stator guides 200 and the three center tap guides 300 with the conductor 301 are snapped into the respective holes in the lower side of plate 100 of FIG. 1B. The anode conductors of center tap guide 300 and stator guides 200 can both be crimped and electrowelded to their respective rectifier diode anodes. Rectifier diodes 400 are pressed into their respective holes in the negative heat sink plate 100. The filter capacitor connector standoff 601 is pressed and riveted into its receiving hole in plate 100. This subassembly is snapped unto the upper assembly as previously described, where the remaining negative rectifier anode leads of diodes 400 are crimped and electrowelded to the respective anode tabs of stator guides 200 and center tap guide 300. The capacitor 600 is soldered to respective standoffs 601, which are mounted in both positive and negative plates 100 and adhesive attached, such as epoxy, to the nearest support standoff 800 to complete the assembly.

The rectifier assembly structure shown in FIGS. 1A and 1C uses the same assembly procedure as described for FIGS. 1A and 1B, except there is no side connector 900, and the stud connector 1000 and spade connector 1100, shown in FIG. 1C, are inserted in the same assembly order as when the side connector 900 had been assembled. Trio mount 700 in either FIG. 1B or FIG. 1C has cut off the unused stud connector tab or the unused side connector tab.

Figure 2:
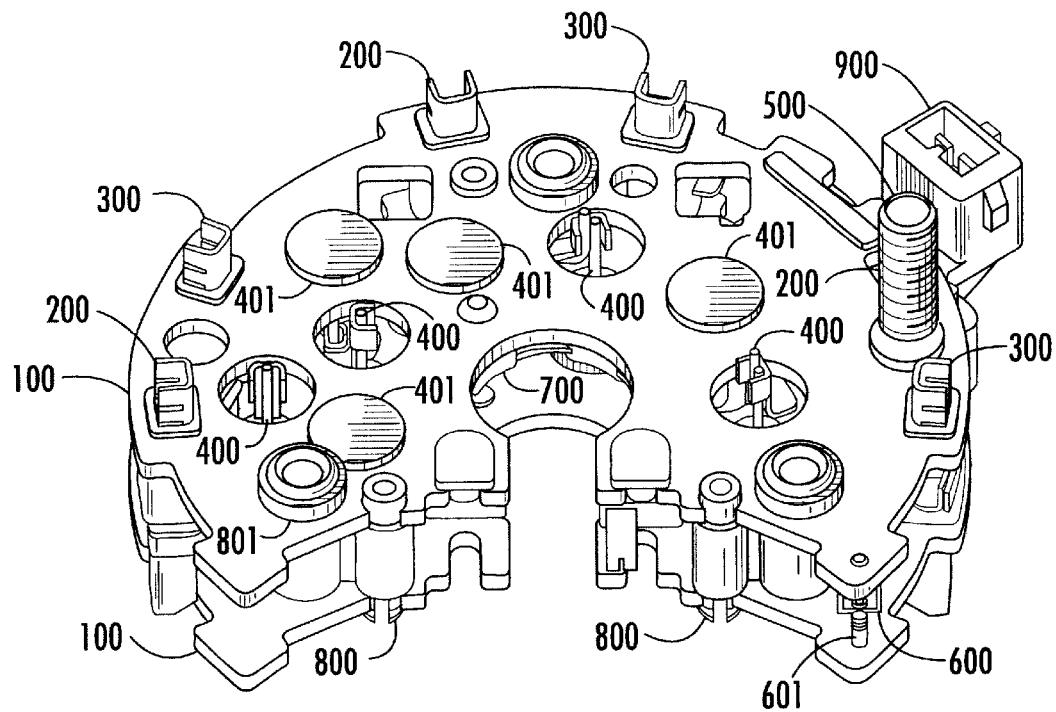
FIG. 2 is an isometric view of the rectifier assembly components shown in FIGS. 1A and 1B and assembled in final form.
Figure 3:
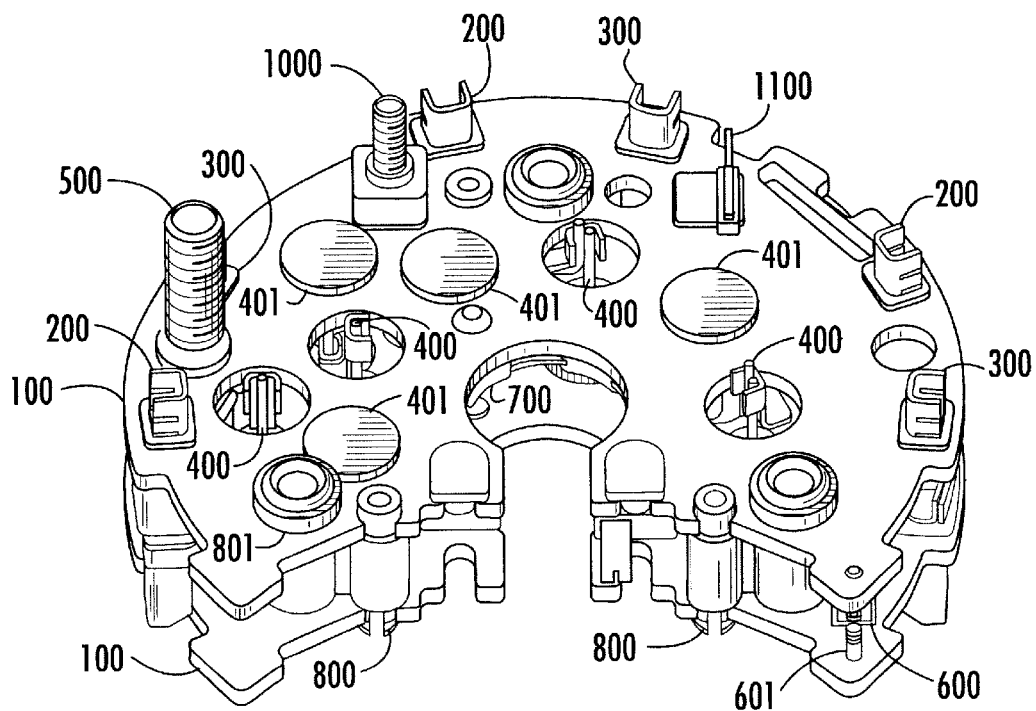
FIG. 3 is an isometric view of the rectifier assembly components shown in FIGS. 1A and 1C and assembled in final form.

FIG. 2 shows the assembled rectifier assembly of FIG. 1A and FIG. 1B. FIG. 3 shows the assembled rectifier assembly of FIGS. 1A and 1C. Each rectifier assembly as shown in FIGS. 2 and 3 is for a different application. Each rectifier assembly is custom assembled for its intended application. All of the components parts, with exception of side connector 900, stud connector 1000, and spade connector 1000, are identical to each other. Thus, in accordance with the present invention, two rectifier assemblies for two different applications with different types of terminals, each with a custom appearance, can be manufactured with a minimal investment in tooling cost and without the additional investment in inventoried components.

The thermal conductor heat sink plate 100 is formed of either aluminum or copper construction, and is dimensioned for mounting in direct contact with a generator, such as used in automobile applications. The diode receiving holes as described before are sized to receive press fit diodes in a metal displacement fashion and provide an air tight seal and maximum electrical and heat conductivity to the heat sink. The lower contact area of diodes are pressed flush to the lower surface of a heat sink for additional electrical and heat conductivity to the generator. Other holes can be provided as clearance holes for the rectifier assembly to the generator end frame attaching screws (not shown). The holes receive integument insulated standoffs to provide alignment for quick assembly and insulation to the cooling plate. Other holes can permit nonconducting passage of an electrode bolt. Joining press fit diodes flush with heat sink plates by manual or semiautomatic assembly techniques rapidly completes the plate subassembly for reduced manufacturing costs.

Figure 4:
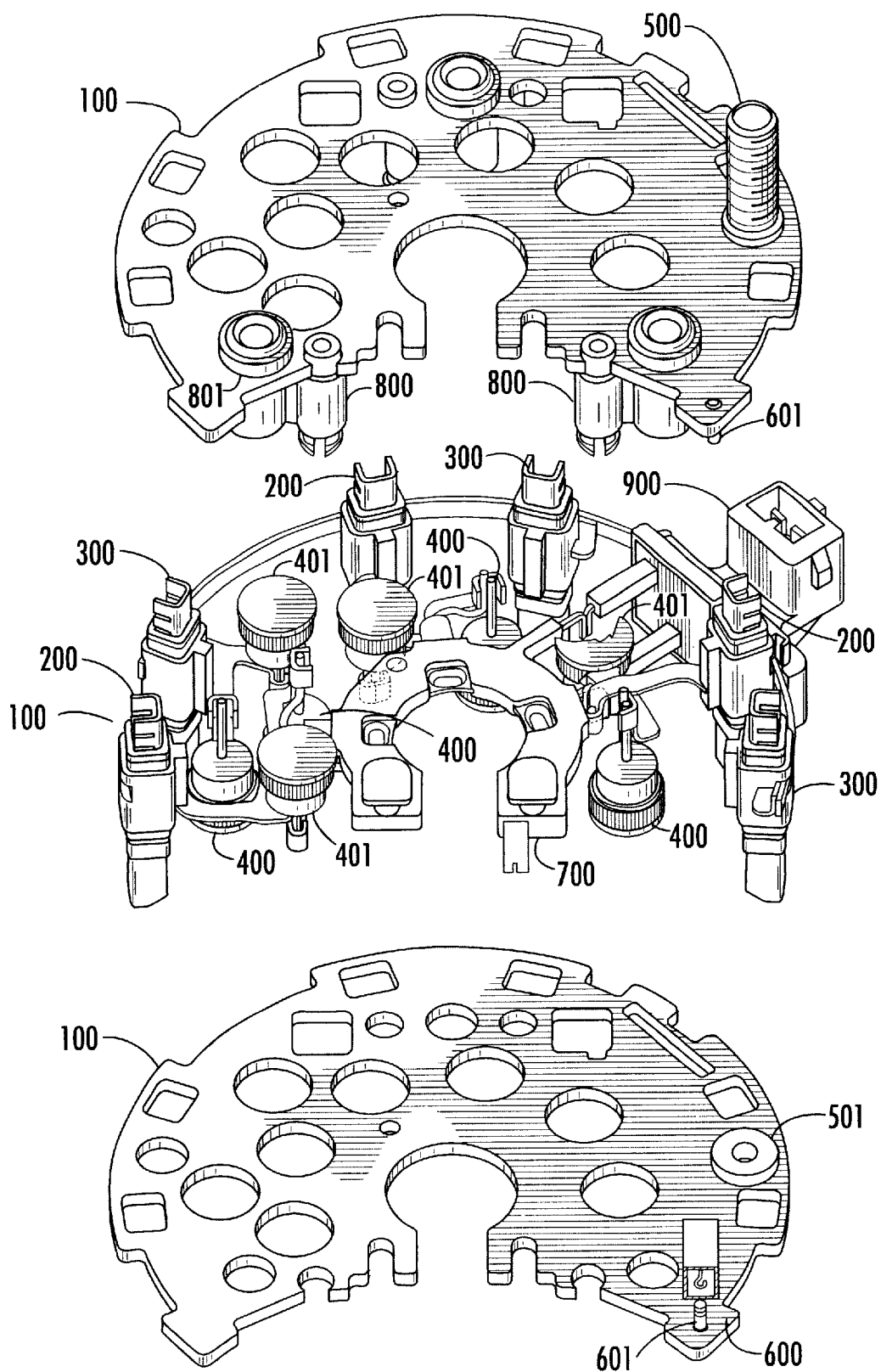
FIG. 4 is another exploded, isometric view of the rectifier assembly shown in FIG. 2 showing separated heat sink plates and showing details of the interconnects as shown in FIGS. 1A and 1B.

FIG. 4 shows the rectifier assembly of FIG. 2 using the identical negative and positive heat sink plates and separated from each other to show details of the component interconnects of FIG. 2. Each diode 400,401 is free from surrounding integument type obstructions to permit the maximum air flow circulation. Air that is drawn through any negative diode 400 lead clearance hole is directed laterally and downward as viewed in the drawing through the positive diode 401 clearance hole, thus, creating a turbulence for maximum cooling. The stator guide 200 embedded conductors are firmly seated in each integument on one end and electrowelded to their respective diode leads on the other end to provide a robust interconnection, while providing minimum resistance to air flow movement.

In a similar fashion, the anode leads of the trio diodes that are mounted in trio diode mount 700 are electrowelded with respective paired negative main rectifier diodes 400, thus, augmenting the rigidity of the assembly. The side connector 900 has one embedded conductor electrowelded to the mating, embedded conductor of the trio mount 700. The other lead of the side connector is paired with a respective positive diode 401 and electrowelded to respective stator guide 200 embedded conductor.

The semicircular center tap conductor is electrowelded to respective tabs on center tap guides 300. Corresponding grooves in stator guides 200 lock the center tap conductor for rigidity. The standoff 601 is both press fitted and riveted to heat sink plates 100 in direct line with capacitor leads 600. The leads are soldered to the standoffs to minimize the series resistance and inductance of the capacitor for maximum transient filtering. It also minimizes the effects of corrosion. Appropriate conductor and appearance areas are masked off and finished with an electrostatically applied, powdered epoxy fluid bed protective coating for durability, non-external electrical conductive insulation, and corrosion resistance.

Figure 5:
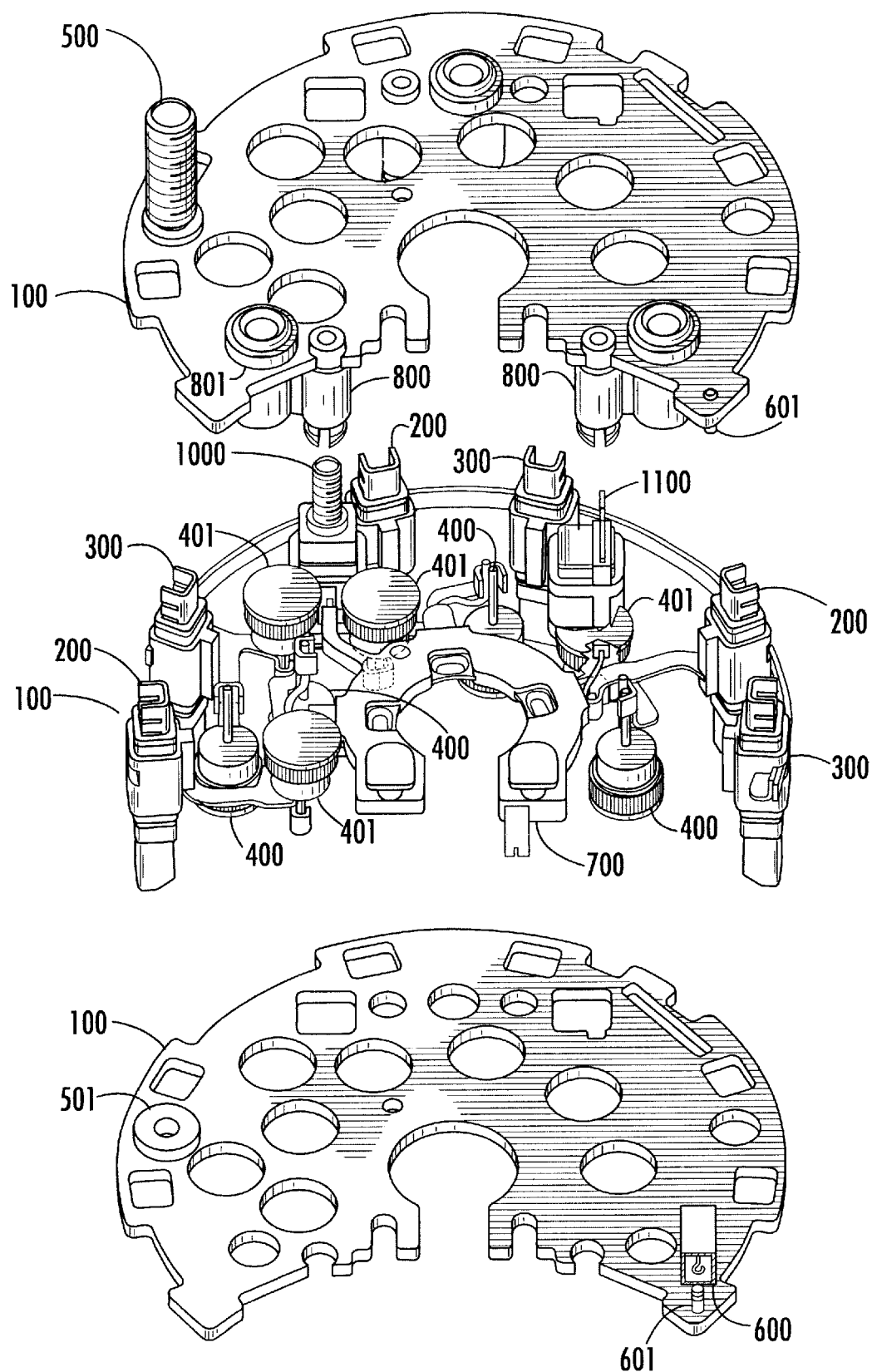
FIG. 5 is another exploded, isometric view of the rectifier assembly shown in FIG. 3 showing separated heat sink plates and showing details of the interconnects shown in FIGS. 1A and 1C.

FIG. 5 shows the rectifier assembly of FIG. 3 with separated negative and positive heat sink plates 100 and showing details of the component interconnects of FIG. 3. FIG. 5 shows threaded bolt terminal 500 mounted in a different location than that location shown in FIG. 4 to accommodate the requirements of a different application. FIG. 5 also shows the removal of the side connector 900 shown FIG. 4, and the installation of stud terminal 1000 and spade terminal 1100, which are used for specific rectifier application. The stud terminal 1000 is electrowelded to an opposing terminal on trio mount 700, whereas the previously used terminal shown in FIG. 4 was severed. The spade terminal 1100 is electrowelded similar to the terminal on side connector 900 (FIG. 4). Thus, with the addition of two relatively inexpensive components, and using the components shown in the rectifier assembly of FIG. 4, an entirely different application is produced for a rectifier assembly.

Figure 6:
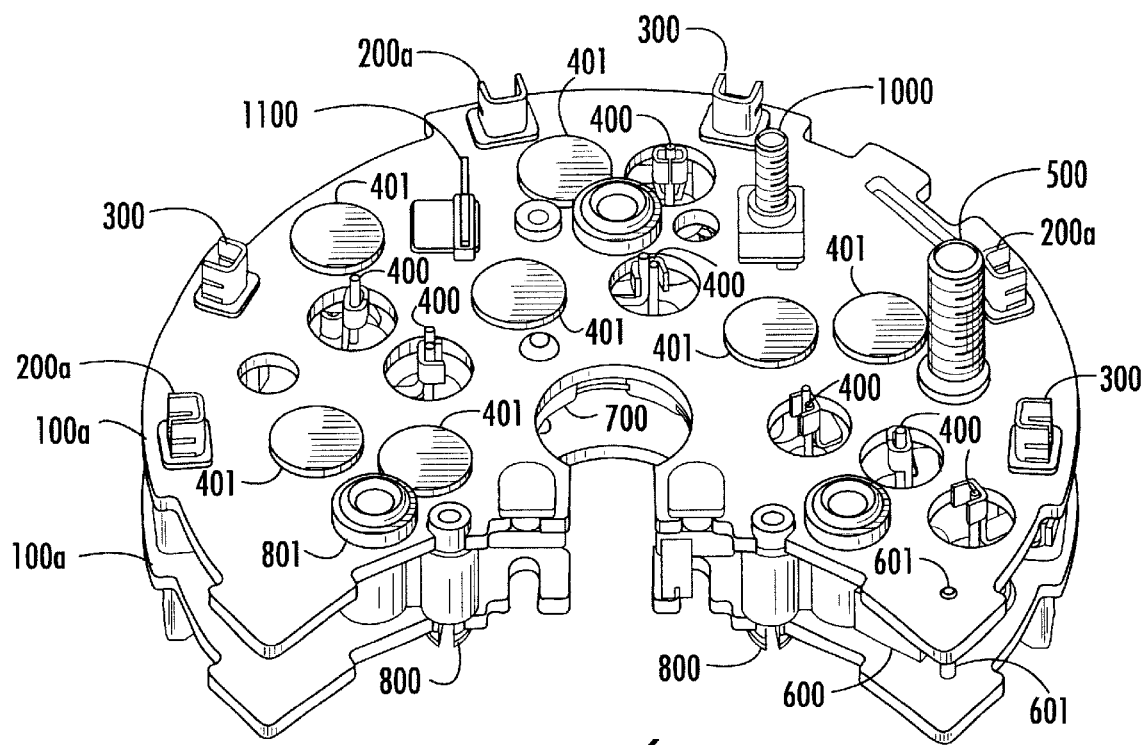
FIG. 6 is an isometric view of a third embodiment of the rectifier assembly of the present invention that uses the basic components shown in FIGS. 1A and 1C, but showing a larger heat sink plate capable of mounting twice the number of rectifier diodes for applications requiring a higher output current.

FIG. 6 shows a high current output version of a rectifier assembly of the present invention using most of the modular components shown in FIGS. 1A and 1C, except a larger heat sink plate 100a is used that is capable of mounting two main rectifier diodes 400,401 in each leg of a three phase "wye" circuit. Both positive and negative heat sink plates 100a are identical to reduce tooling and inventory cost. The heat sink plates are also designed for mounting center tap fed main diodes. Key components include the main rectifier diodes, the spade terminal 1100 and stud terminal 1000.

Figure 7:
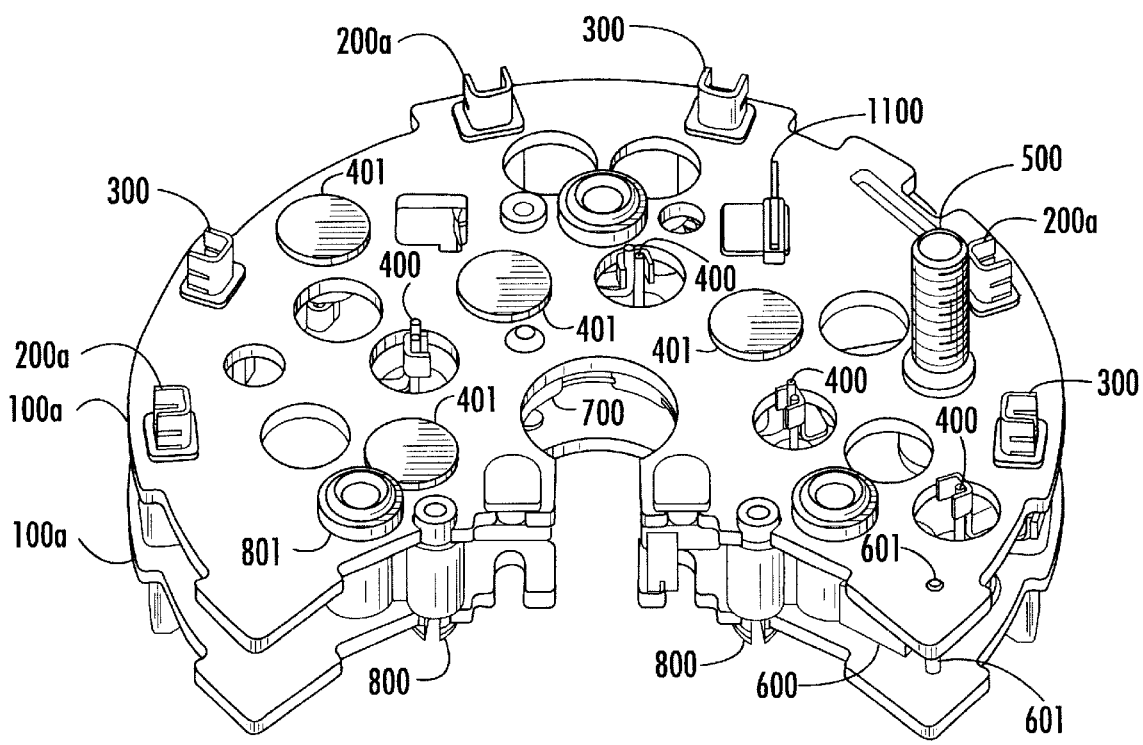
FIG. 7 is an isometric view of a forth embodiment of the rectifier assembly of the present invention that is similar to FIG. 6, but using a different output interface obtained by removing a stud terminal and replacing it with a spade terminal.

FIG. 7 illustrates another rectifier assembly used in a different application. Parallel and center tap diodes and the stud terminal 1000 are no longer used. The spade terminal 1100 has been moved as shown in FIG. 7, different from its location shown in FIG. 6. The requirements of an entirely different application are met with no additional tooling cost or expenditures in inventory.

Figure 8:
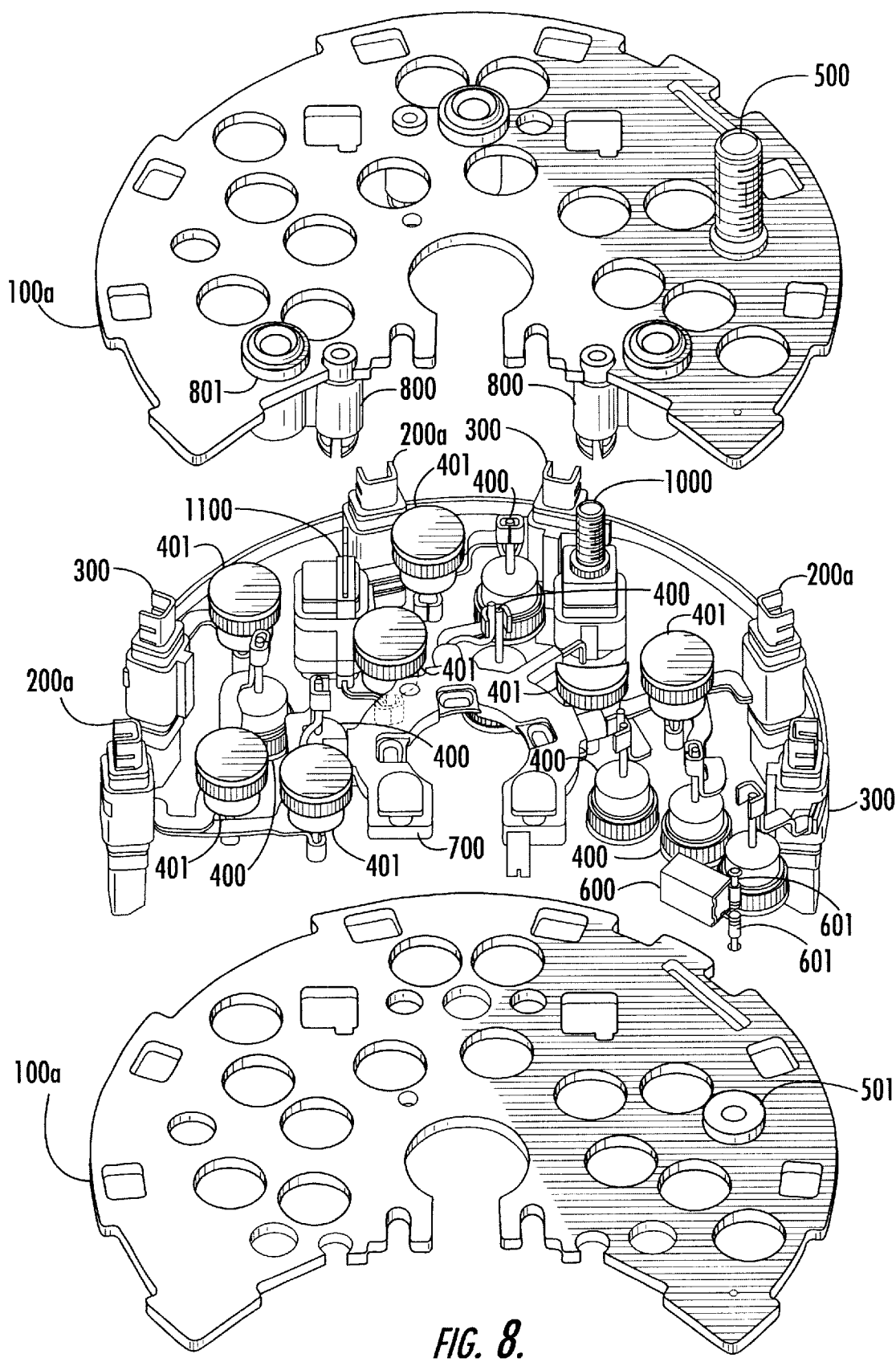
FIG. 8 is an exploded, isometric view of the rectifier assembly shown in FIG. 6 with separated heat sink plates and showing details of the interconnects shown in FIGS. 1A and 1B.

FIG. 8 shows the rectifier assembly of FIG. 6 having the identical negative and positive heat sink plates 100a separated from each other to show details of the component interconnects of FIG. 6. FIG. 8 is an entirely different application for the rectifier assembly as compared to the rectifier assembly shown in FIG. 5, but shares the same assembly methods and design characteristics as explained with reference to FIG. 4. The identical components are used except a larger and identical heat sink plate is shown as referenced by the "a" suffix in FIG. 8. A larger diameter center tap conductor ring is electrowelded to the identical center tap guides 300 and to the extended length embedded conductor, but it is embedded into the same mold to form stator guide 200 in FIG. 5 or stator guide 200a in FIG. 8. Thus, with a few metal stampings used in place of identical metal stamping as shown in FIG. 5, a rectifier assembly of professional and custom appearance is produced with parallel rectifier diodes, a larger diameter heat sink, and an approximate doubling in output current capacity, but with minimum investment in both tooling and inventory cost.

FIGS. 2 and 8 show the differences in actual physical size of the rectifier assemblies, but they are shown in intermediate sizes of different application rectifiers that share the modular components of FIGS. 2 and 8, and the resultant advantages of this invention.

FIG. 9A illustrates a threaded battery terminal stud 500 and mating insulating shoulder washer 501. The shaft 506 is of a dimension to fit within the center hole 507. FIG. 9B rotates the view shown in FIG. 9A 180° to illustrate details of the bottom of the stud 500 and washer 501. Referring to FIG. 9B, the extended diameter portion 502 acts as a stop, thus, limiting movement of the stud 500 when it is pressed into its corresponding hole in the heat sink plate 100 or 100a as shown in FIG. 9C.

Referring now to FIG. 9B, the serrated section 503 bites into the plate hole to prevent rotation and provide a corrosion resistant seal to the plate. The lip 505 is shown in its preriveted state, thus, permitting insertion clearance in the corresponding plate hole. FIG. 9c shows the stud 500 positioned in the corresponding hole of plate 100 (shown in phantom view). FIG. 9D shows threaded bolt 500 pressed into the corresponding plate 100 (or 100a) hole before the riveting operation. FIG. 9E shows the same threaded bolt as in FIG. 9D after the riveting operation, which provides vibration free mechanical and an air tight corrosion resistant attachment with maximum contact area for a low resistant electrical connection. FIG. 9F details the final threaded bolt 500 and insulating washer 501, the lower or positive plate 100 or 100a, and the upper or negative plate 100 or 100a in phantom view, illustrate the robustness and simplicity of this portion of the rectifier assembly.

Figure 10A:
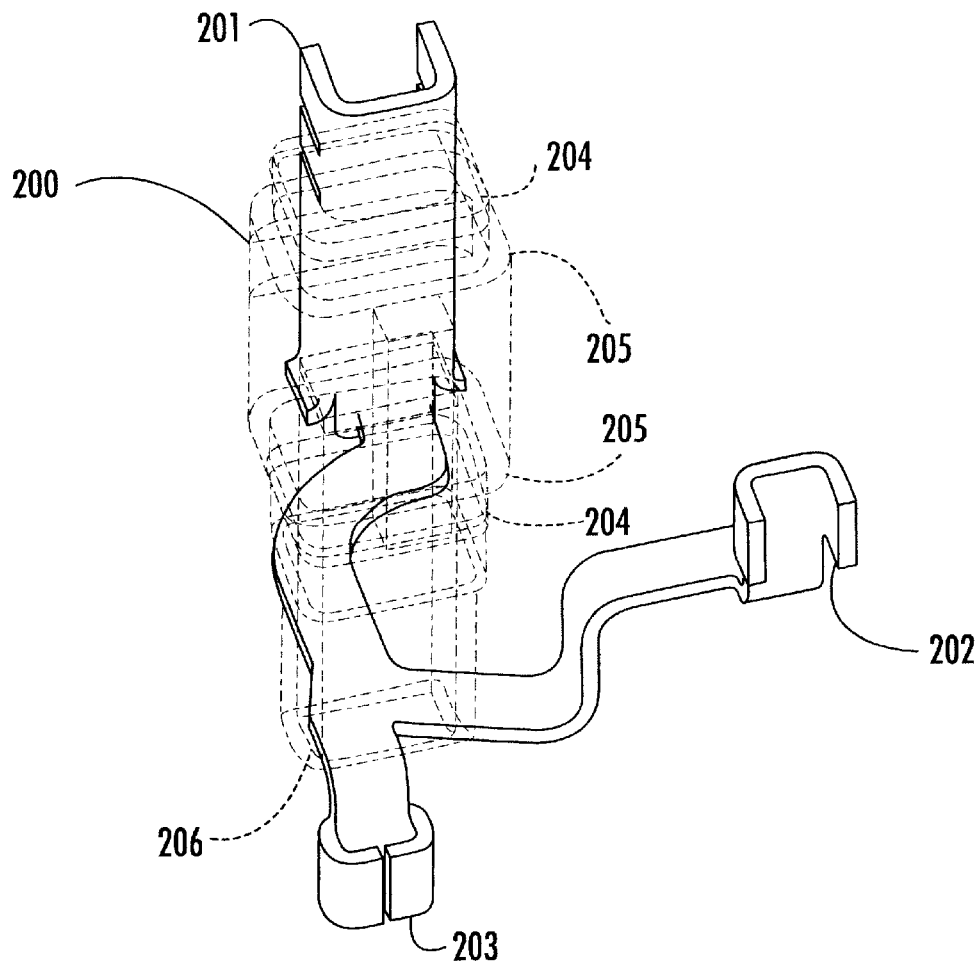
FIG. 10A is an isometric view of the stator guide conductor embedded integument in phantom lines and showing details of the embedded conductor.

FIG. 10A shows the stator guide conductor embedded integument. The plastic insulator portion is shown in phantom view. The embedded conductor can be stamped and shaped as single form, with no internal welds, resulting in maximum conductivity. Alternator stator leads (not shown in detail) are guided upward through passage 206 and slightly beyond crimp terminal 201. After lead passage, the terminal portion 201 is crimped and electrically welded for both mechanical and electrical integrity. The terminal portion 203 slides over the pressed-in positive diode lead 401 and it is crimped and electrowelded as illustrated in FIG. 8. The terminal portion 202 receives the negative diode lead 400 and the corresponding trio diode lead in a similar fashion and is crimped and welded. Both upper and lower surfaces 205 act as stops to separate precisely the plates 100, 100a. Upper and lower wedges 204 lock the stator guide 200 into corresponding holes in plates 100, 100a to aid in the assembly process.

Figure 10B:
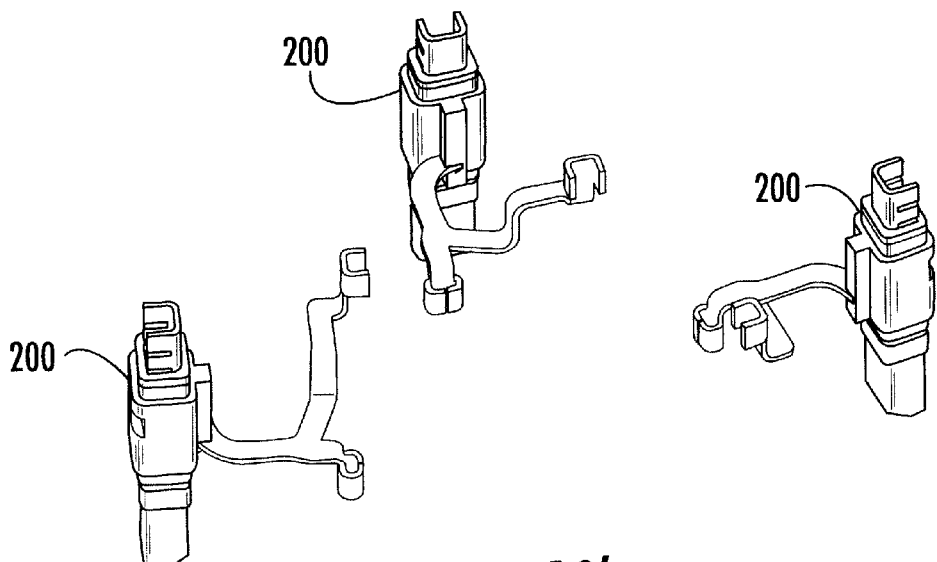
FIG. 10B is an isometric view of the stator guide conductor embedded integument with the three identical guides laid out in a rectifier assembly.

FIG. 10B shows the three identical stator guides of FIG. 10A drawn in the positions they would occupy if inserted into the corresponding holes in plates 100, 100a. In accordance with the present invention, the three stator guides 200 as shown in FIG. 10B are identical and suitable for a multiple rectifier assembly applications.

Figure 11A:
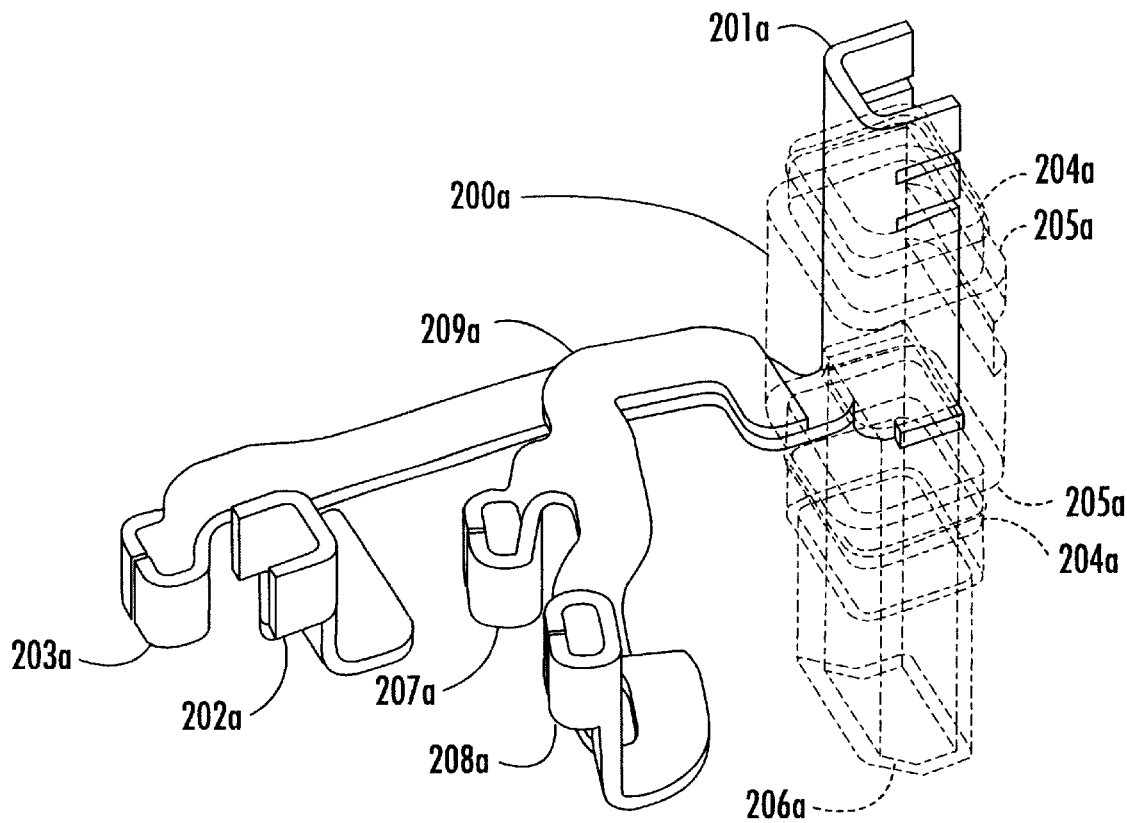
FIG. 11A is an isometric view of the stator guide conductor embedded integument in phantom lines and showing details of the conductor used for high capacity generators.
Figure 11B:
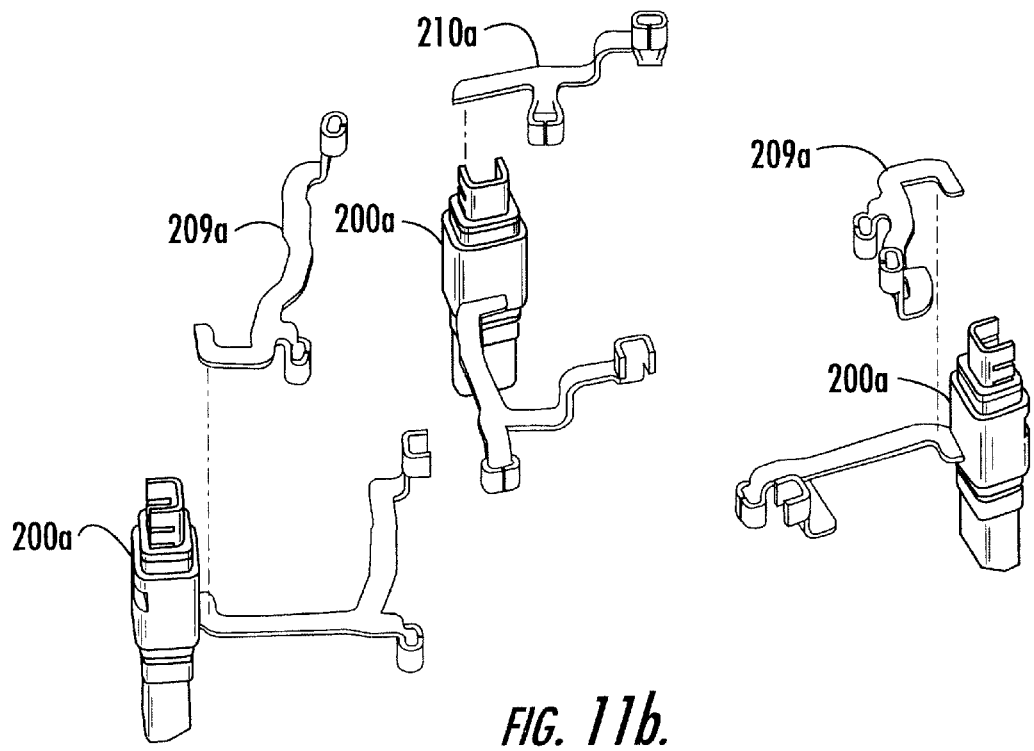
FIG. 11B is an isometric view of the stator guide conductor embedded integument and showing three identical guides in the positions used in rectifier assemblies and showing optionally formed conductors for parallel diode rectifier applications.

FIG. 11A shows an adapted stator guide of FIG. 10A, where the insulated plastic integument shown in the phantom lines of FIG. 11A is identical to the integument shown in FIG. 10A. The embedded conductor of FIG. 11A is similar in construction to the embedded conductor shown in FIG. 10A. One major difference is the length of the arm that resides between the terminal portions 203a and 202a and the plastic integument. In FIG. 11A, this arm is made longer to accommodate rectifier assemblies of a larger output current capacity. In the present invention, the same molds are used to form the assembly as shown in FIG. 10A, which can be used to form the assembly shown in FIG. 11A. In this manner, only the conductive portion of FIG. 11A is tooled to host rectifier assemblies of a higher current capacity. FIG. 11B shows the relative locations of the three identical stator guides 200a when they are snapped into the corresponding holes in plate 100a. An optional parallel diode conductor 209a and 210a can be electrowelded to the corresponding stator conductors for applications requiring a parallel diode configuration. By manufacturing these parallel diode conductors, a different rectifier assembly application can be accomplished adding these two components.

Figure 12A:
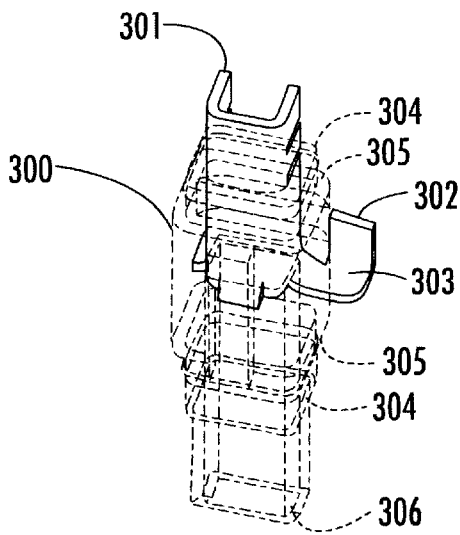
FIG. 12A is an isometric view of the center tap guide conductor embedded integument in phantom lines and showing details of the conductor.
Figure 12B:
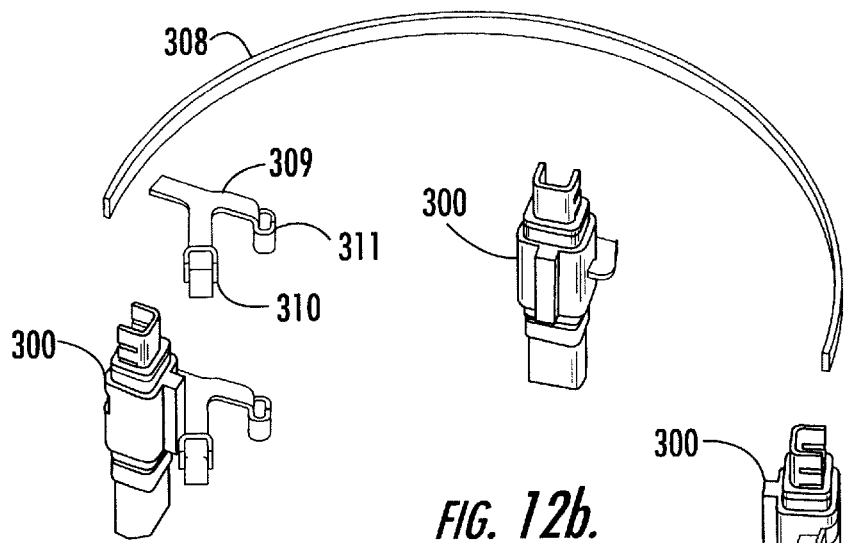
FIG. 12B is an isometric view of the center tap guide conductor embedded integument and three identical guides with an optionally formed conductor for a center tap diode rectifier and a conductor ring to terminate stator lead ends and form a stator wye circuit.

FIG. 12A shows the center tap guide 300 and the plastic insulator portion in phantom form. Top and bottom surfaces 305 control the spacing of the plates and contribute to the overall rigidity of the final rectifier assembly. Both top and bottom wedges 304 permit snapping of the center tap guide into the corresponding plate hole and to aid the assembly process, preventing these components from falling out during handling. The passage 306 guides the stator leads through the integument to just above the terminal 301. The tabs are crimped and electrowelded to form a corrosion resistant connection. Tab 302 provides a mating surface to the conductor arc 308 (FIG. 12B). The tab is electrowelded to the arc, which can be formed to various radii to accommodate different rectifier applications.

Figure 12C:
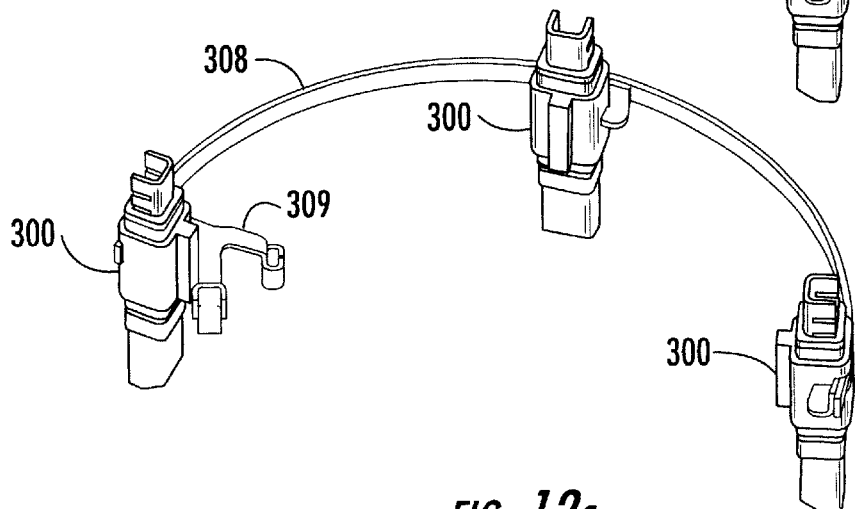
FIG. 12C is an isometric view of the center tap guide conductor embedded integument and showing three identical guides and an optionally formed conductor for a center tap diode rectifier application and a conductor ring to terminate stator lead ends and form a stator wye circuit, after the electroweld process.

FIG. 12B is an exploded view showing the components used to form the center tap guide assembly. The three identical center tap guides 300 are positioned in a manner that illustrates how they will be inserted into the plate. For applications requiring the use of center tap fed main rectifiers, the conductor 309 is electrowelded to a conductive arm on one of the three center tap guides. The semicircular conductor 308 is electrowelded to the tabs 302, as previously described. The center tap conductor 309 is formed with a terminal 301 for both crimping and electrowelding to a negative main rectifier diode. The terminal 311 allows conduction to the positive main rectifier diode. Conductor 309 is not required. where there is no center tap fed. FIG. 12C shows the assembled center tap guide assembly after electrowelding. It can be snapped into the corresponding plate.

FIG. 13A shows the universal standoff 800 used on all rectifier assembly applications. Upper and lower surfaces 800g provide stops, which precisely space the heat sink plates. The rim 880b mates with the corresponding hole in the plate. Through hole 800e provides passage for the eyelet 802, as shown in FIG. 13C. The rim 800c mates with the corresponding hole in the plate to prevent rotation. The hole 880d provides an attachment point for a coarse, threaded screw for attaching external devices (not shown). The wedge 800a provides a locking mechanism when attaching the negative heat sink plate. Cone 800f provides a tapered seat for the riveted end of eyelet 802b, as shown in FIG. 13D. FIG. 13B shows details of the insulating eyelet washer 801. The washer is symmetrical and can be installed in either direction. The hole 801a receives the preriveted end of the eyelet 802a. It is formed from a suitable metallic material. FIG. 13D shows the same eyelet of FIG. 13C in the postriveted stage.

FIG. 13E is an exploded isometric view of the standoff components. Standoff 800 is inserted into its respective hole in the positive heat sink plate. Insulating washer 801 is dropped onto eyelet 802 and the assembly is inserted into the respective receiving hole in the standoff 800 as shown in FIG. 13F. The end of the eyelet is formed to secure the components (FIG. 13G). The rim 800b shown in FIG. 13A and the insulating washer 801 shown in FIG. 13B both insulate the metallic eyelet 802 from the heat sink (shown in phantom lines in FIG. 13G). FIG. 13H shows the final assembly of the standoff components where three identical standoff subassemblies are attached to the positive heat sink plate 101a (or 100 as in FIG. 1B). The negative heat sink plate 101a is shown in phantom view and snaps onto the tangs 800a shown in FIG. 13A. Thus, the standoff 800 can be applied to an entire family of different rectifier assemblies and provide precise nonconductive spacing of the two conductive heat sink plates. The standoff also holds the two plates together and attaches an external accessory (not shown). The standoff also allows an attachment screw to be inserted for mounting the rectifier assembly to a generator.

Figure 14A:
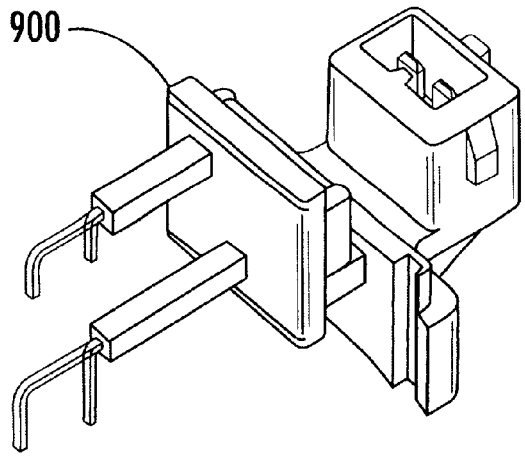
FIG. 14A is an isometric view of the side connector that can be used in the present invention.
Figure 14B:
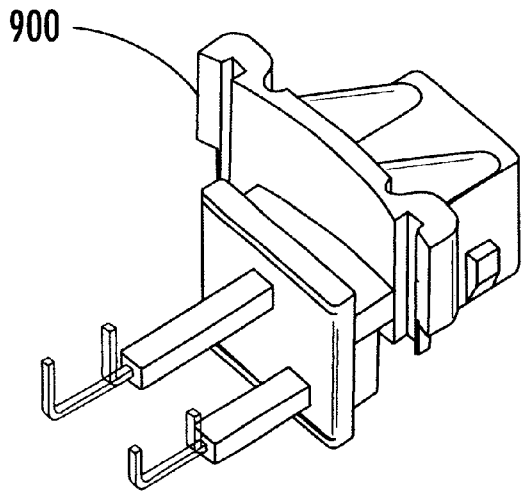
FIG. 14B is an isometric view of the side connector of FIG. 14A, but inverted 180 degrees to show details of its lower side.
Figure 14C:
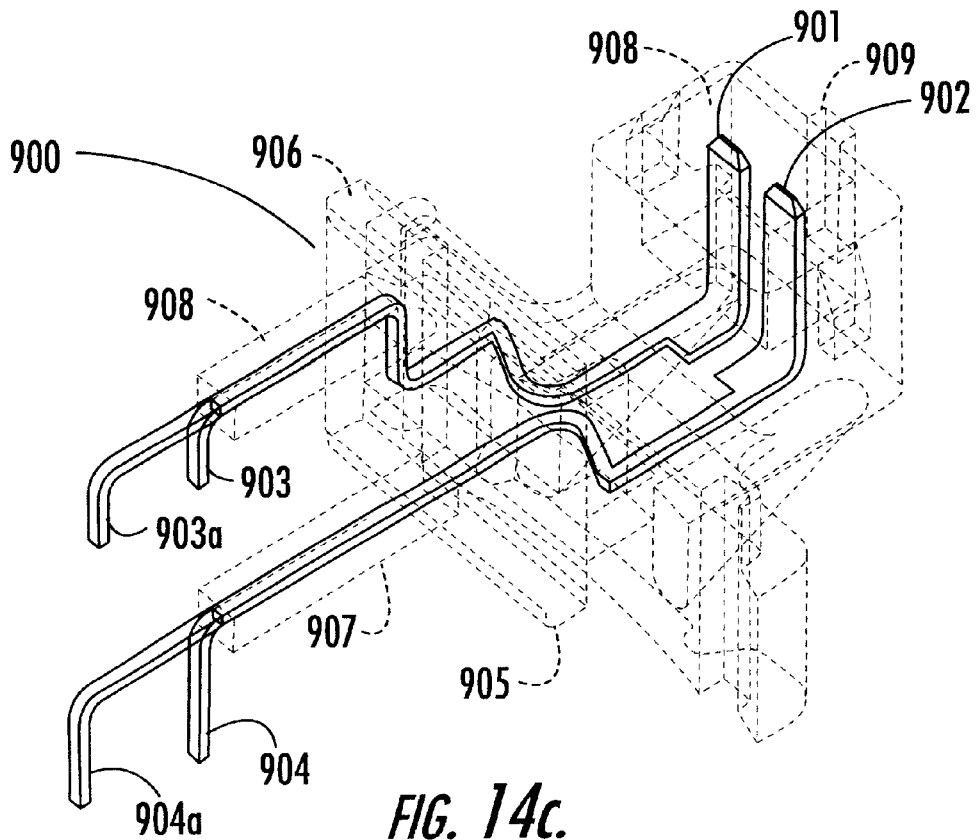
FIG. 14C is an isometric view of the side connector and insulator integument in phantom form, and showing the embedded conductors.

FIG. 14A shows the side connector 900, and FIG. 14B shows the side connector 900 of FIG. 14A rotated 180° to illustrate provide the detail of the lower portion of side connector 900. FIG. 14C shows the side connector 900 with the plastic insulator integument shown in phantom lines. As previously described, the side connector 900 is essentially a circuit to output both the rectified field excitation voltage and provide an output of one of the stator end leads. As noted before, the present invention tools one part that serves for different applications independent of the current output capacity of a particular rectifier assembly.

The two conductors shown in FIG. 14C are plated to withstand corrosive forces and are stamped and formed to the specific shape. Tabs 901 and 902 receive a suitable mating connector. As the diameter of the rectifiers varies in accordance with the output current capacity, mating conductor ends 903 and 904 can be easily bent to accommodate the rectifier assemblies. For example, the conductive ends 903 can be bent short for smaller diameter rectifier assemblies, whereas end 903a could accommodate a larger rectifier assembly. In the actual side connector 900, either bent 903 or 903a could be used, but not both. One side connector assembly always suits the entire family of rectifier assemblies. Wedges 906 and 907 provide a snap in mechanism to hold the side connector to the respective holes in the heat sink plates and facilitate assembly.

Figure 15A:
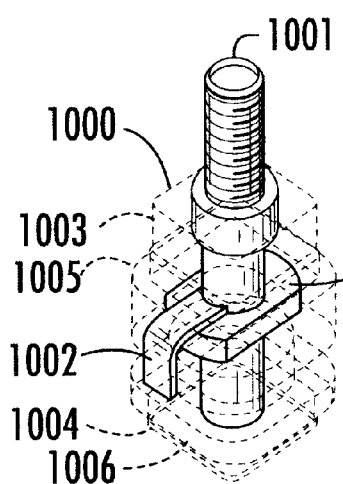
FIG. 15A is an isometric view of the stud connector and insulator integument in phantom lines, and showing the embedded conductors.
Figure 15B:
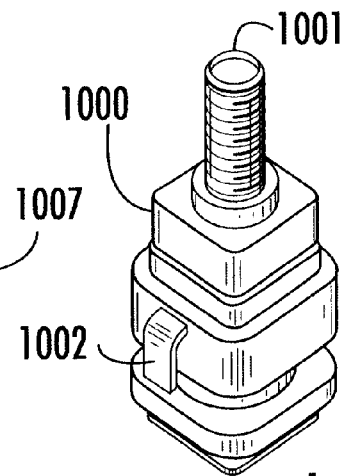
FIG. 15B is an isometric view of the stud connector.
Figure 15C:
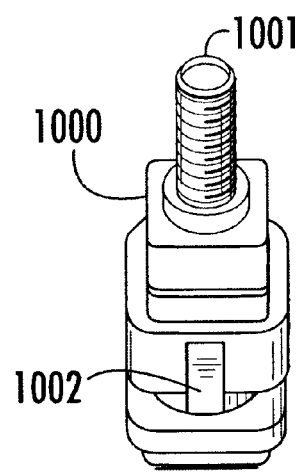
FIG. 15C is an isometric view of the stud connector rotated 45° on a vertical axis.

FIG. 15A shows the studded field excitation connector 1000, the embedded conductor, and machined stud. Tab 1002 is electrowelded to the machined stud extension 1007. This assembly is embedded into the insulator integument. Threaded stud portion 1001 accepts a suitable ring terminal, which is held fast by a mating nut. Integument surfaces 1005 and 1006 provide a stop for the proper heat sink plate spacing. Wedges 1003 and 1004 provide a locking snap action to hold the stud assembly in place during assembly. The view in FIG. 15B emphasizes the curvature of connecting tab 1002. FIG. 15C shows the same component rotated on a vertical axis, 45° to the right. The single stud connector 1000 serves different applications and reduces tooling and inventory cost.

Figure 16A:
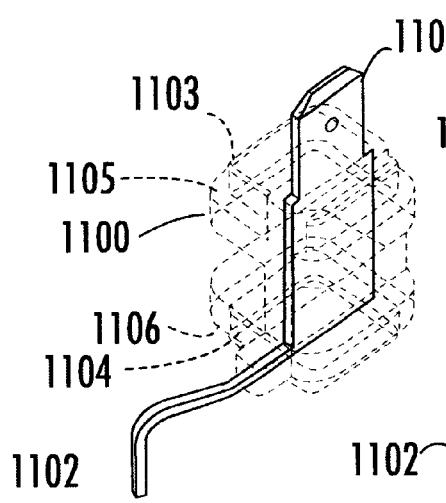
FIG. 16A is an isometric view of the spade connector and insulator integument in phantom lines, and showing the embedded conductors.
Figure 16B:
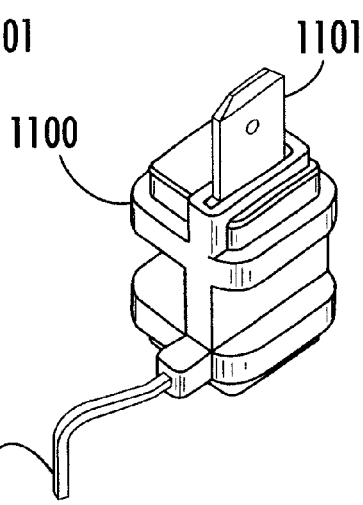
FIG. 16B is an isometric view of the spade connector.
Figure 16C:
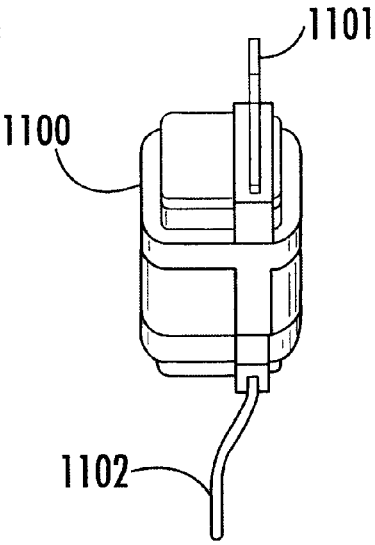
FIG. 16C is an isometric view of the spade connector and 45° on a vertical axis.
Figure 16D:
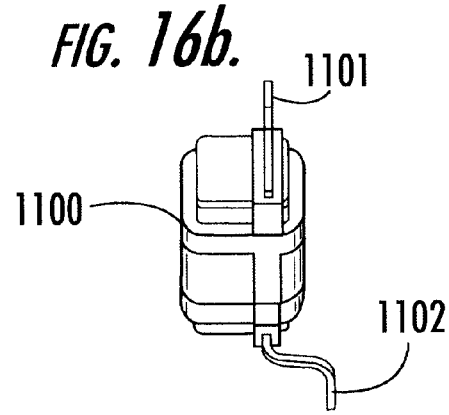
FIG. 16D is an isometric view of the spade connector shown in FIG. 16C, but showing a variation on the shape of the lower conductor for use in a different rectifier application.

FIG. 16A shows the spade connector 1100 and the embedded conductor. Surfaces 1105 and 1106 provide heat sink spacing. Wedges 1003 and 1006 hold the component securely in the respective holes of the heat sink plates. FIG. 16C shows the spade connector rotated 45° to the right on its vertical axis from the view shown in FIG. 16B, and illustrates how the stud connector 1100 is shown in the assembly drawings. FIG. 16D shows a variation of how the connecting conductor 1102 is formed, as opposed to the conductor in FIG. 16C. This conductor is crimped and electrowelded with one of the main diode leads. This adapts the spade connector to the family of rectifier assemblies.

Figure 17A:
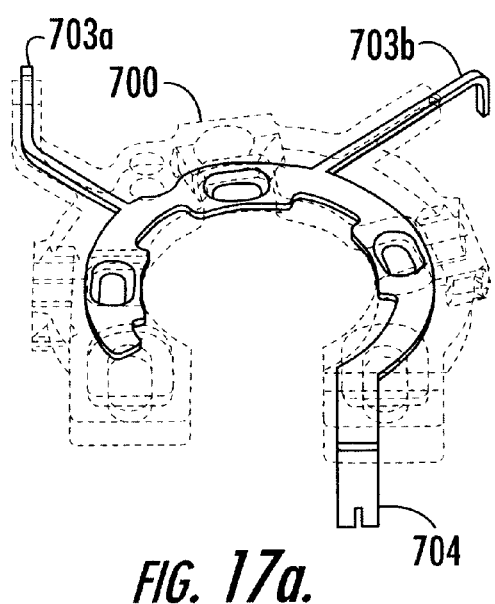
FIG. 17A is an isometric view of the trio diode conductor embedded integument mount and the insulator integument in phantom lines, and showing the embedded conductors.

FIG. 17A shows the field excitation diode mounting integument 700 and the embedded conductor. This module mounts and connects standard, axial aligned lead diodes to rectify the stator voltage and provide a direct current for the field rotor coil (not shown). Conductors 703a and 703b connect the field excitation voltage to either the side connector 900, as shown in FIG. 14A, the stud connector 1000 as shown in FIG. 15A, or the spade connector 1100 as shown in FIG. 16A. The unused conductor 703a or 703b is sheared off so that the diode mount 700 is universal in all applications. Spring tab 704 is electrowelded to the main embedded conductor for contact with a voltage regulator element (not shown).

Figure 17B:
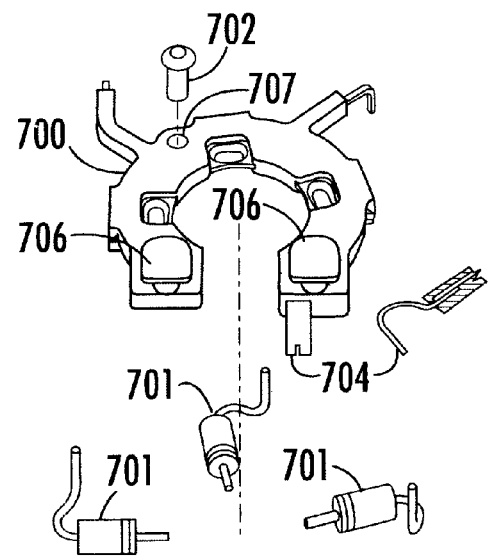
FIG. 17B is an exploded view of the trio diode conductor embedded integument mount and associated subassembly components, including three diodes having preformed leads and an eyelet.
Figure 17C:
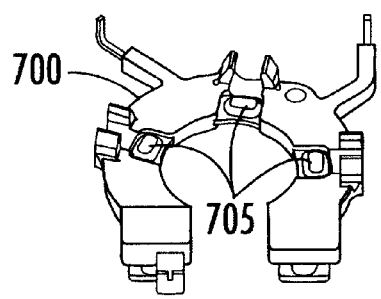
FIG. 17C is an isometric view of the trio diode conductor embedded integument mount rotated 180° from the view shown in FIG. 17B.
Figure 17D:
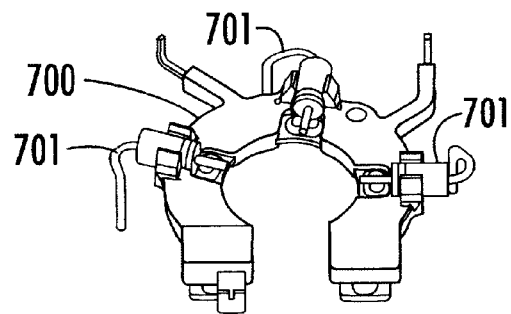
FIG. 17D is an isometric view of the trio diode conductor embedded integument mount rotated 180° from the view in FIG. 17B, and showing the diodes of FIG. 17B snapped into position and prepared for electrowelding of the cathode leads to the embedded conductor.
Figure 17E:
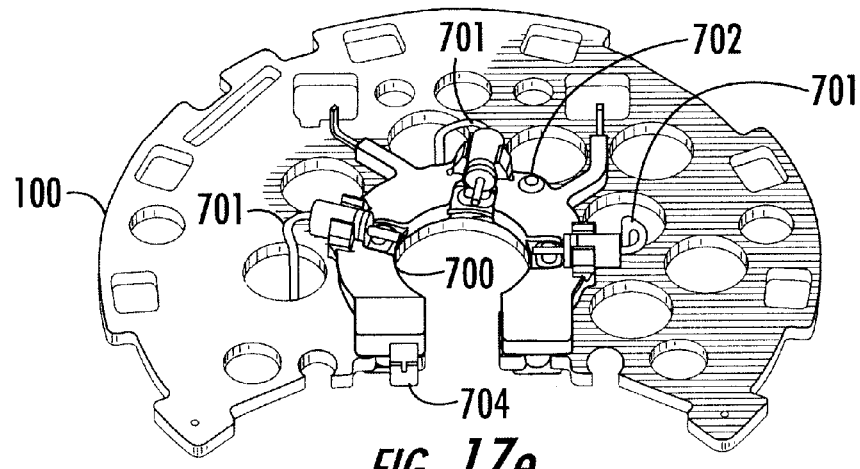
FIG. 17E is an isometric view of the trio diode conductor embedded integument mount that is secured by eyelets onto heat sink plates.
Figure 18:
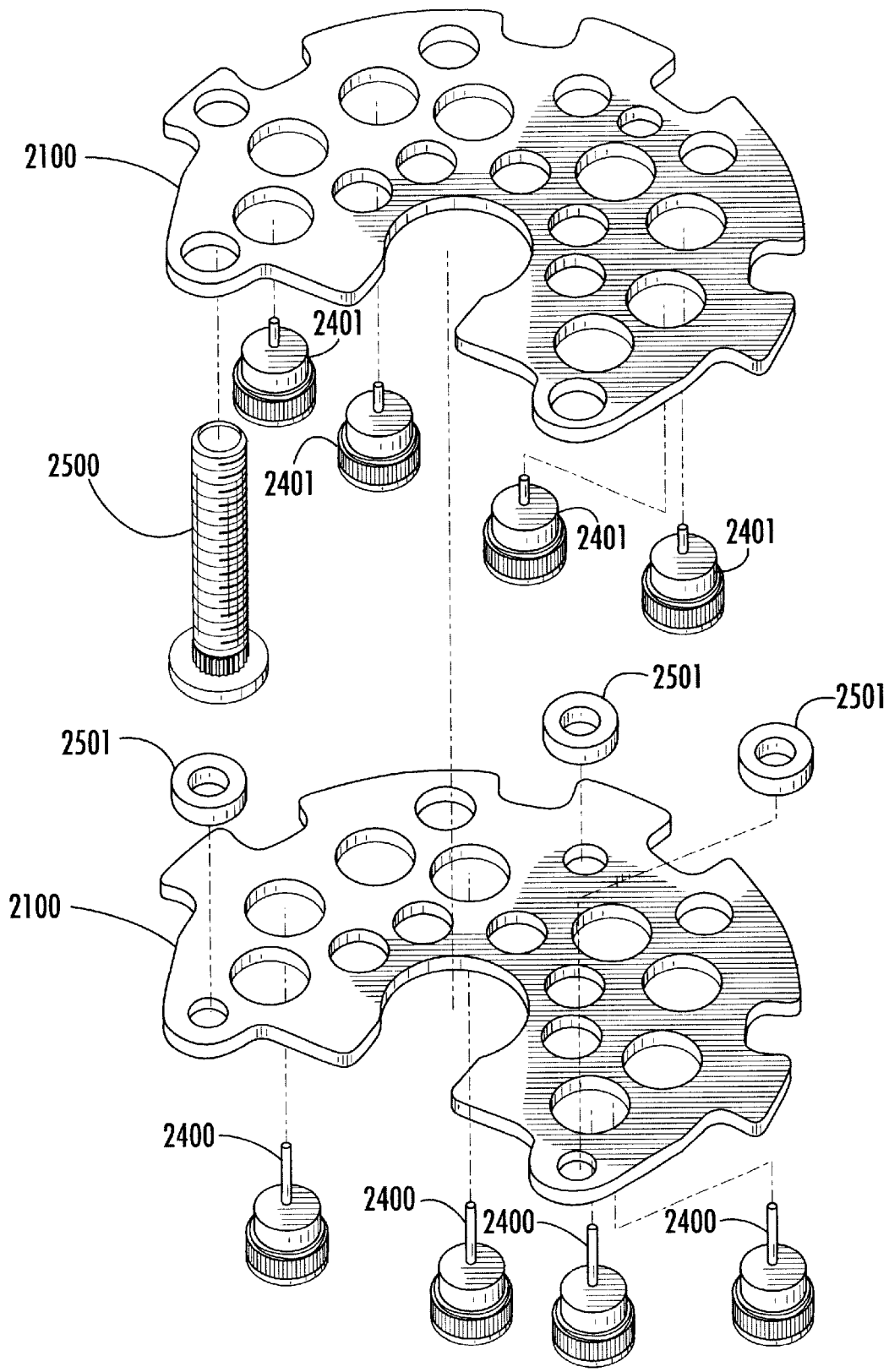
FIGS. 18–28 show a rectifier assembly of the present invention where the lead frame is placed to the outside of the heat sink plates instead of between the heat sink plates.

FIG. 17B is a solid view of the diode mount module shown in FIG. 17A. The spring tab 704 is drawn to emphasize this particular component. Mushroom type extensions 706 slide into the respective slots in the positive heat sink. The eyelet 702 is inserted into the respective heat sink hole and riveted for a firm, but rapid attachment to said heat sink. Trio or field excitations 701 are shown in the lower portion of FIG. 17B. Each diode has identically preformed leads and are drawn in the relative position they would sit within the diode mount module. FIG. 17C shows the diode mount of FIG. 17B rotated 180° to provide a bottom view of the mount in FIG. 17C. Dimples 705 provide a surface where the cathode lead of each respective diode can be electrowelded. FIG. 17D is the same view as FIG. 17C, but with diodes 701 snapped into their respective holders. The three cathode leads are electrowelded to their respective dimples, completing the assembly procedure for this module. FIG. 17E shows the preassembled module of FIG. 17D mounted on the inner side of the positive heat sink plate 100 with the eyelet 702 riveted into position. The anode ends of each diode will be crimped and electrowelded to its respective main diode to complete the field excitation trio diode circuit.

FIGS. 18–28 illustrate a further aspects of the present invention where the plastic, insulator integument acting as a lead frame is placed to the outside of the heat sink plates. For purposes of explanation in the drawings, the same reference numerals are used on like components as in the description of FIGS. 1–17E, except they are raised to the two thousand series (2000).

Figure 19:
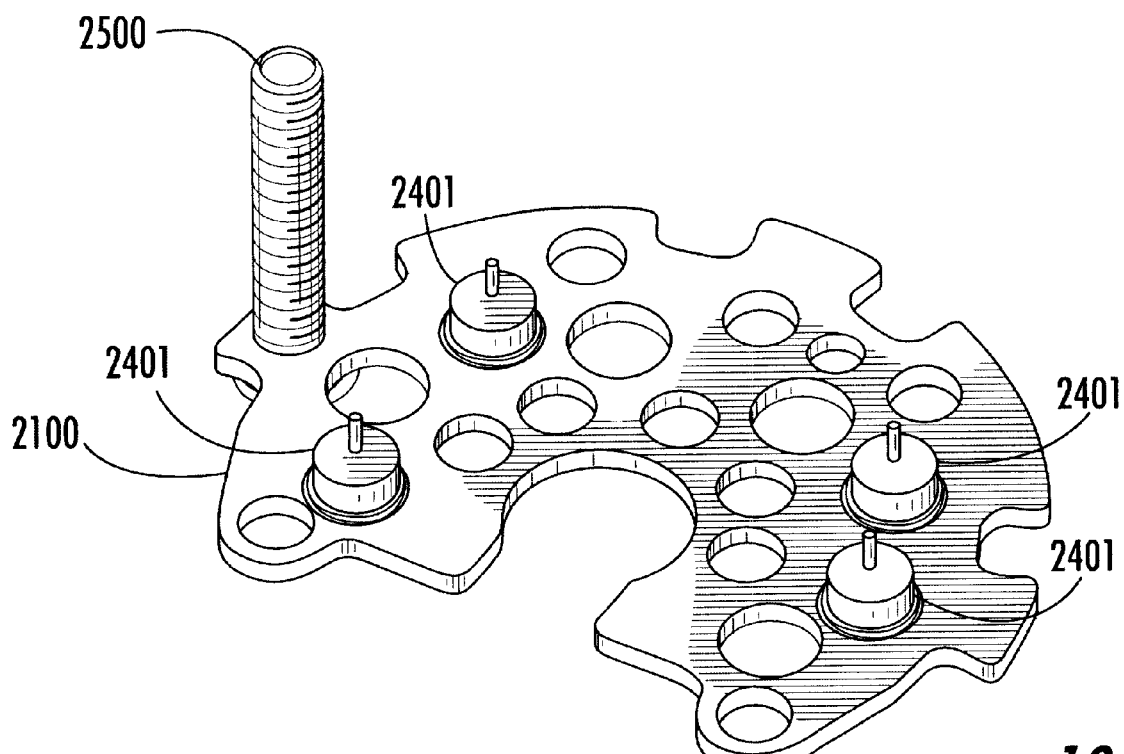
Figure 20:
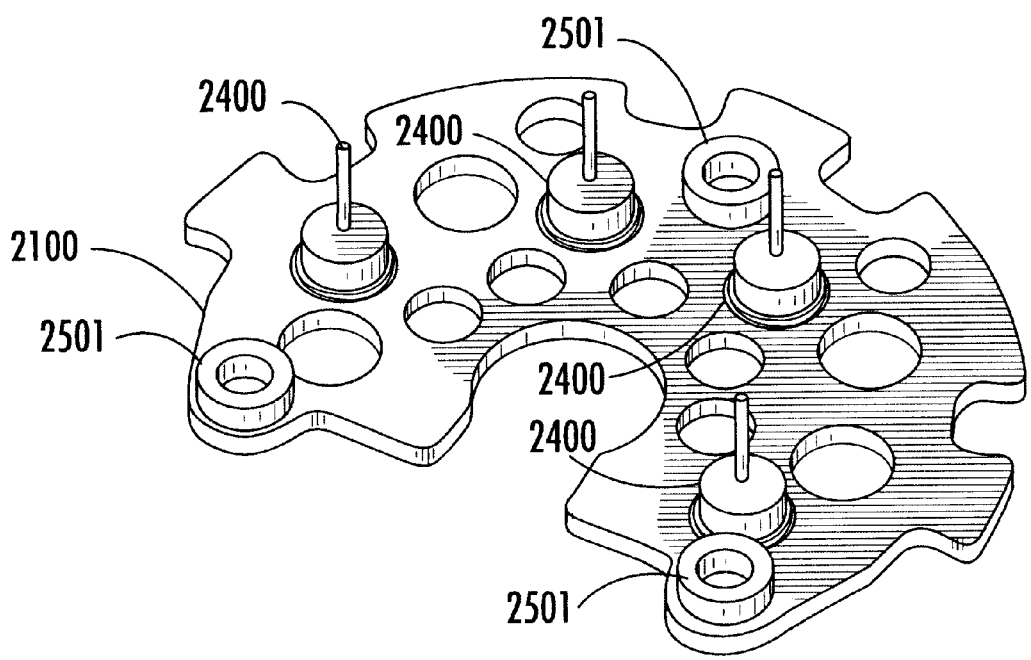
Figure 21:
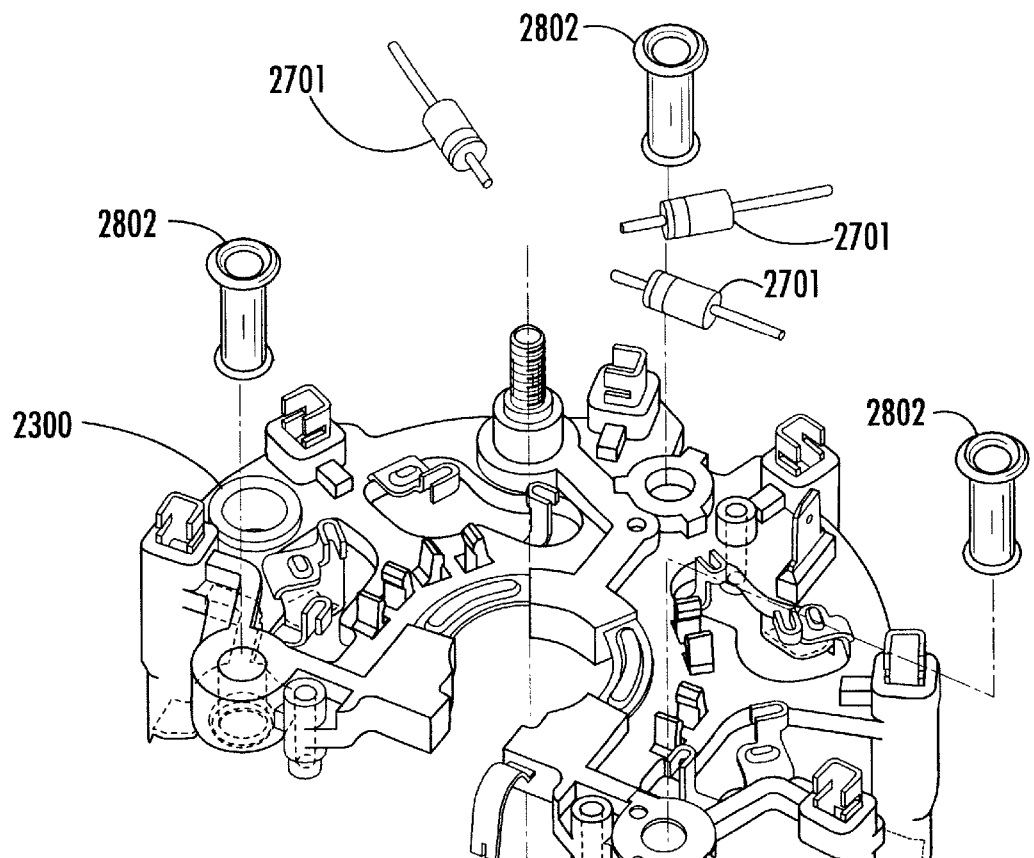
Figure 22:
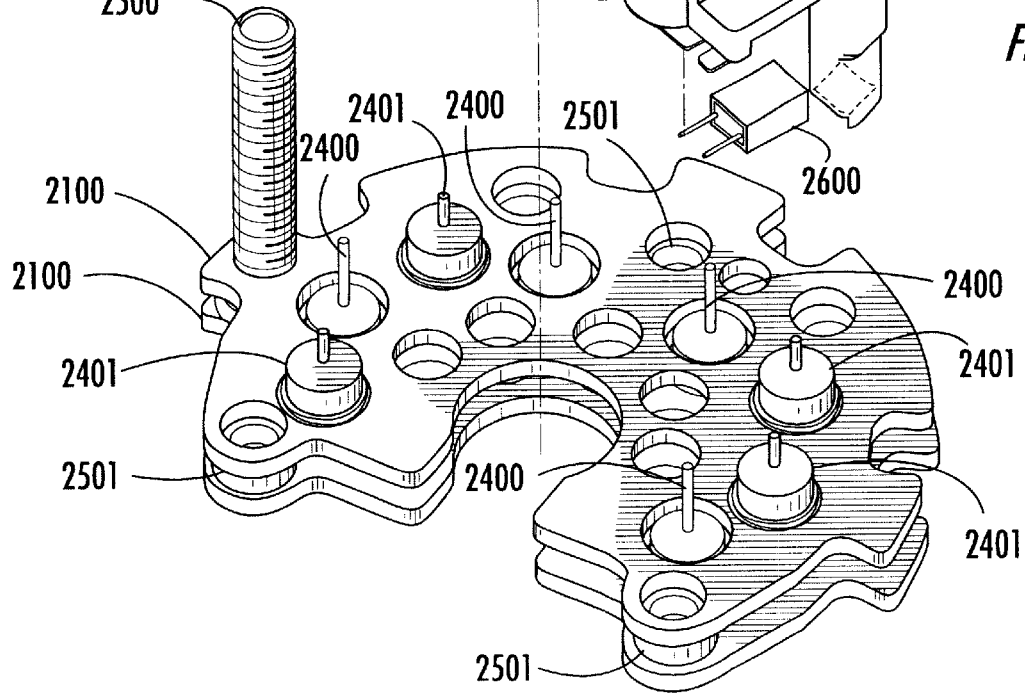
Figure 23:
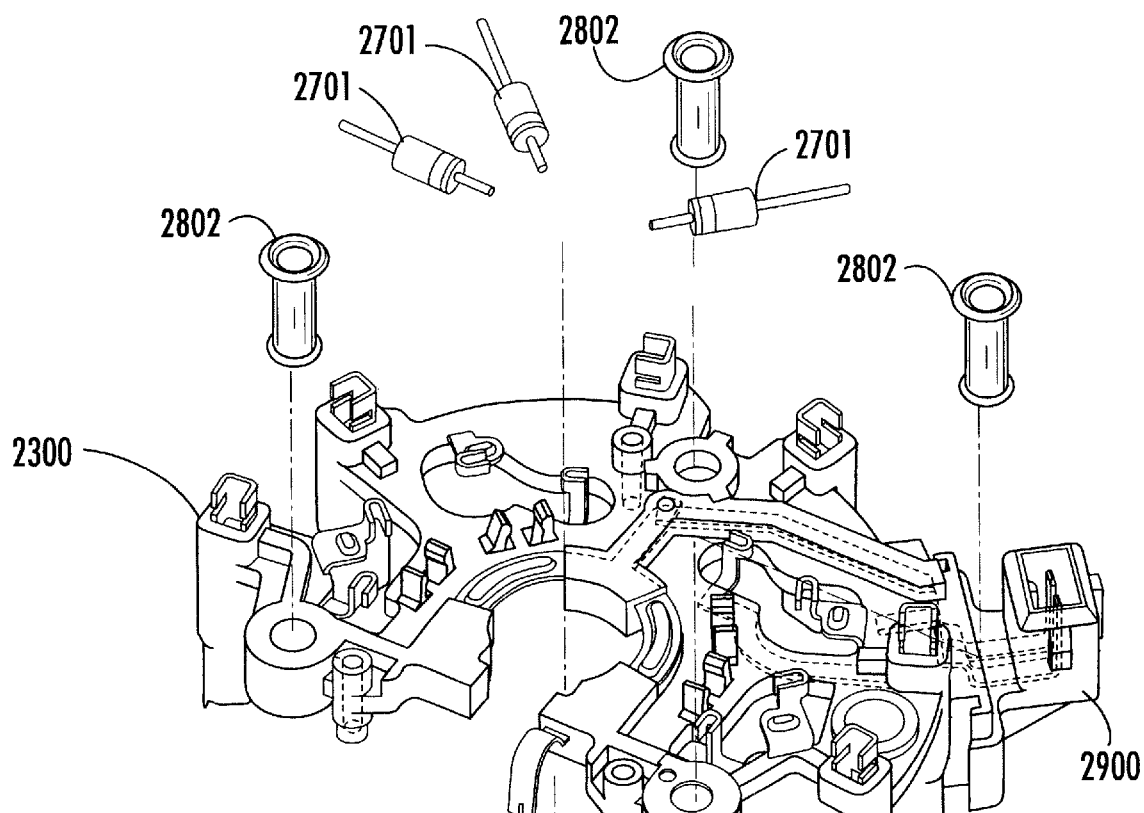
Figure 24:
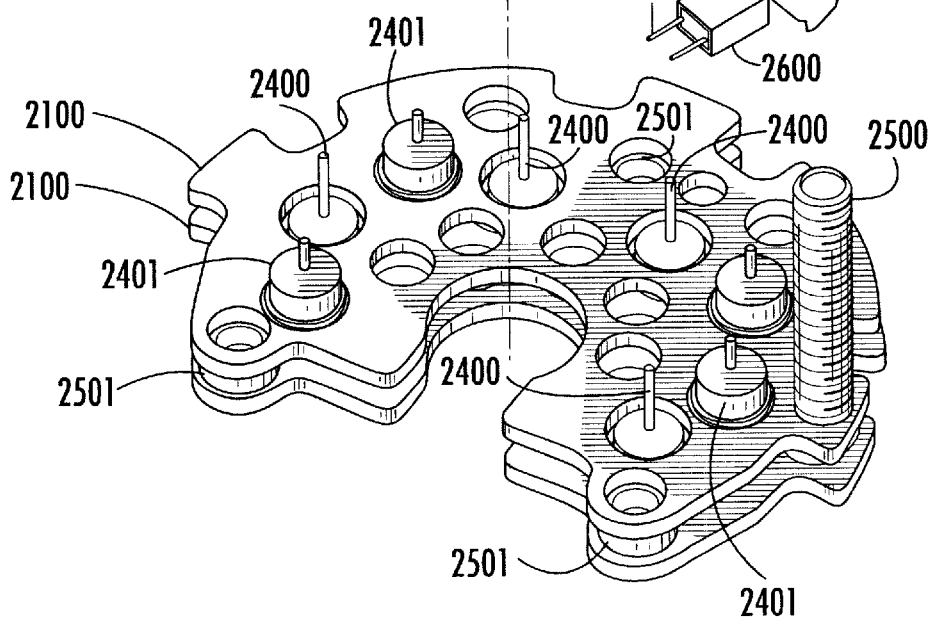
Figure 25:
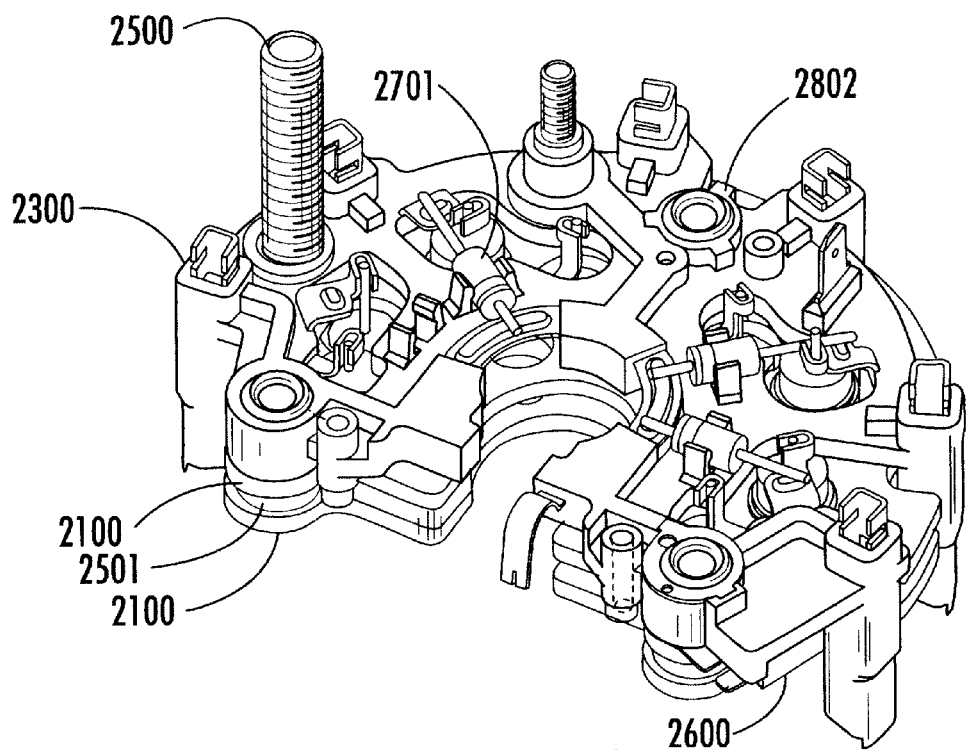
Figure 26:
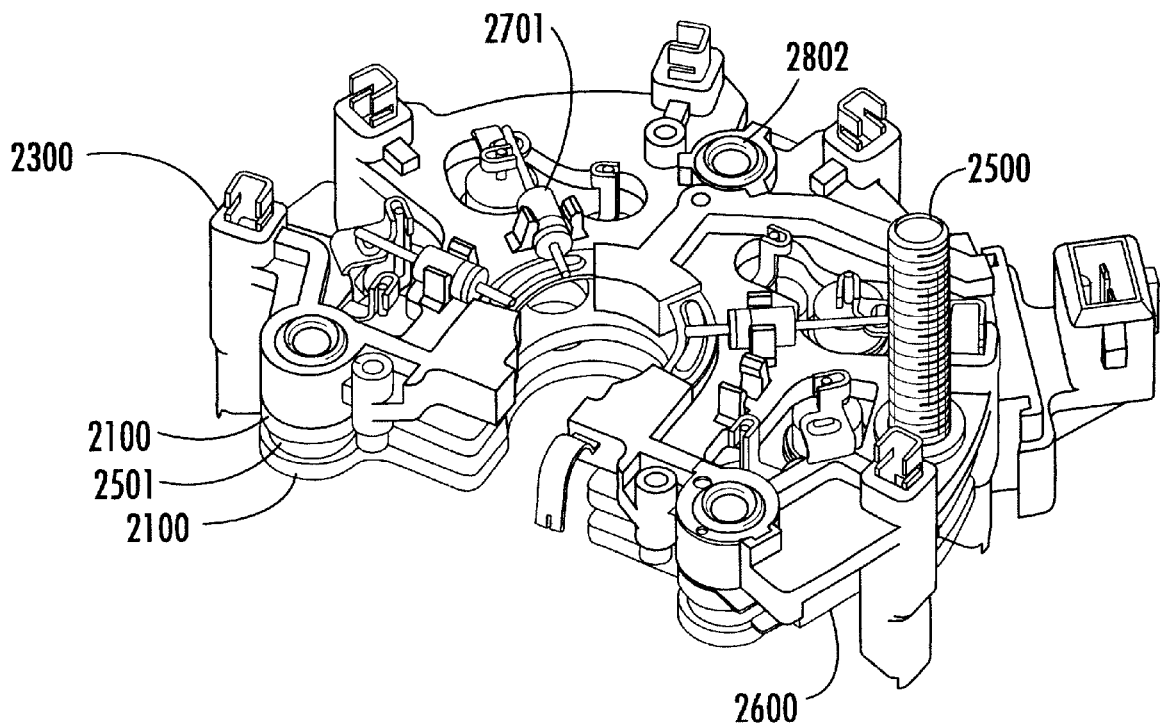
Figure 27:
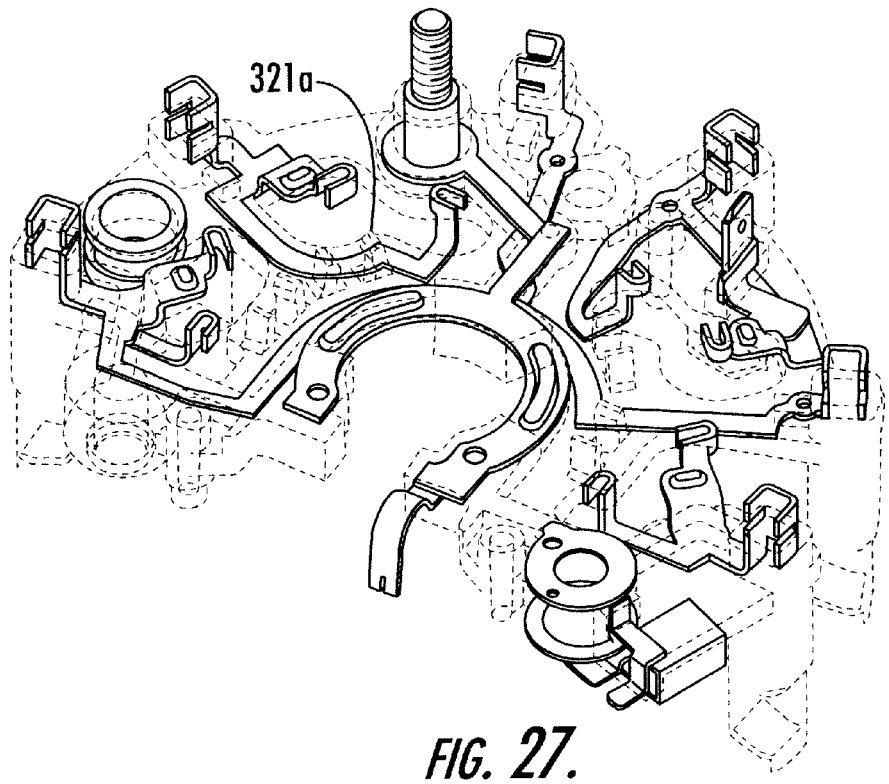
Figure 28:
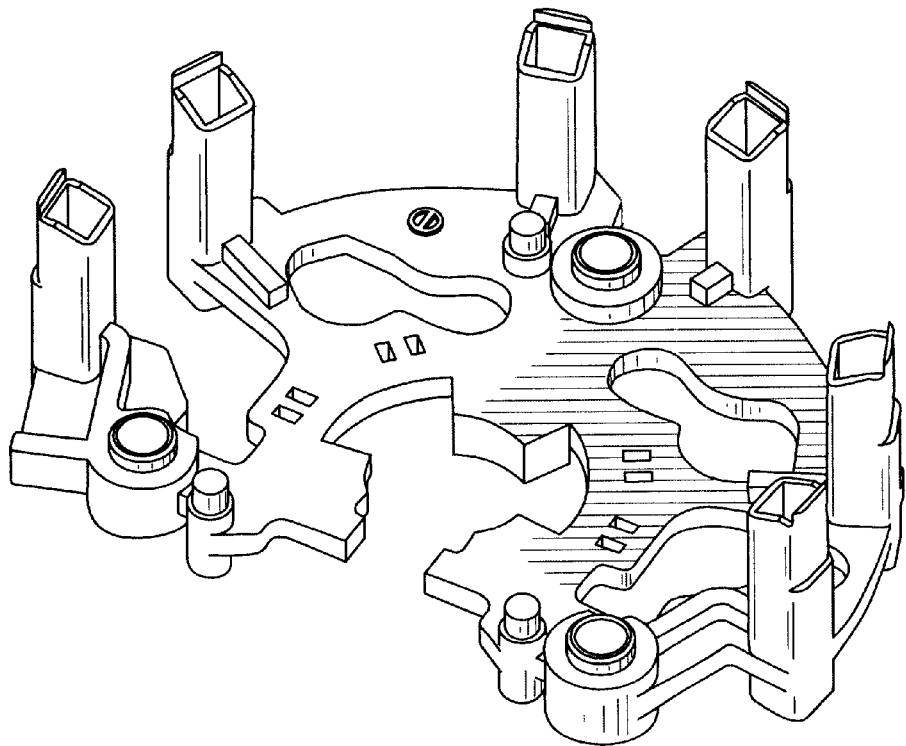

As shown in FIGS. 18–28, the positive and negative heat sink plates 2100 are positioned with insulator spacers 2501 to allow fabrication in spaced relation and include a threaded output terminal 2500. The diodes 2400, 2401 are positioned as facing in the same direction and received through the appropriate diode receiving holes, as shown in FIGS. 19 and 20. FIG. 21 shows an insulator lead integument 2300 with other component parts mounted thereon relative to the assembled diode heat sink plates shown in FIG. 22. These components include field excitation diodes 2701, eyelet insulators 2802, filter capacitor 2600, and the other components operative with these listed components. The stud connector 3000 is mounted on the integument. FIGS. 23 and 24 show the embodiment using the side vehicle connector 2900 instead of the stud connector shown in FIG. 21. FIGS. 25 and 26 illustrate the assembled rectifier assembly having the insulated lead frame, i.e., integument 2300, positioned on an outside surface of one of the heat sink diode plates instead of sandwiched between. FIG. 27 shows various portions of the integument and phantom and showing details of the various conductors. FIG. 28 shows details of the insulator forming the integument without conductors with various added formed support mounts and components. Diodes 2701 can be snap fit onto the lead integument by snap fit connectors, as illustrated. Other components can be snap fit as illustrated.

This application is related to copending patent applications entitled, "VEHICULAR MODULAR DESIGN MULTIPLE APPLICATION RECTIFIER ASSEMBLY," which is filed on the same date and by the same assignee and inventors, the disclosure which is hereby incorporated by reference.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A rectifier assembly comprising:
   two substantially identical and interchangeable heat sink plates mounted parallel to each other in spaced relation, each heat sink plate having a plurality of identically positioned diode mounting holes;
   a plurality of rectifier diodes mounted within said diode mounting holes, each diode having a diode electrode, wherein one plate is selectively negative or positive dependent on the polarity of diodes mounted within the plate such that one heat sink plate is negative and the other heat sink plate is positive, said diode electrodes extending in a common direction, wherein diode mounting holes not receiving diodes therein are adapted to provide diode electrode clearance and ventilation; and
   a lead integument formed from an insulator material and mounted on a heat sink plate opposing the other heat sink plate having embedded conductors and connectors that interconnect diode electrodes and other rectifier components.

2. A rectifier assembly according to claim 1, and further comprising a plurality of standoffs formed of an insulator material and mounted between the two heat sink plates for separating the two plates.

3. A rectifier assembly according to claim 2, wherein the standoffs are mounted by snap fit connection into a heat sink plate.

4. A rectifier assembly according to claim 1, wherein the heat sink plates are substantially semicircular configured and adapted to be mounted within an automotive generator.

5. A rectifier assembly according to claim 1, and further comprising a plurality of diode mounting positions on the lead integument for receiving field excitation diodes that interconnect lead integument connectors and diodes.

6. A rectifier assembly according to claim 5, wherein said diode mounting positions further comprises diode mounting clips that receive a diode in a snap fit connection.

7. A rectifier assembly according to claim 1, and further comprising a threaded output terminal mounted on a heat sink plate and extending through the lead integument.

8. A rectifier assembly according to claim 1, and further comprising component attachment positions formed on said heat sink plates for receiving one of a side connector, stud terminal and/or spade terminal.

9. A rectifier assembly according to claim 8, wherein the one of a side connector, stud terminal and/or spade terminal and component attachment positions are configured for snap fit connections.

10. A rectifier assembly comprising:
    two substantially identical and interchangeable heat sink plates mounted parallel to each other in spaced relation, each heat sink plate having a plurality of identically positioned diode mounting holes;
    a plurality of rectifier diodes mounted within said diode mounting holes, each diode having a diode electrode, wherein one plate is selectively negative or positive dependent on the polarity of diodes mounted within the plate such that one heat sink plate is negative and the other heat sink plate is positive, said diode electrodes extending in a common direction such that negative diode electrodes extend toward the heat sink plate having positive diodes and extend through diode mounting holes not receiving diodes therein for diode electrode clearance and ventilation; and
    a lead integument formed from an insulator material and mounted on the heat sink having the positive diodes and having embedded conductors and connectors that interconnect diode electrodes and other rectifier components.

11. A rectifier assembly according to claim 10, and further comprising a plurality of standoffs formed of an insulator material and mounted between the two heat sink plates for separating the two plates.

12. A rectifier assembly according to claim 11, wherein the standoffs are mounted by snap fit connection into a heat sink plate.

13. A rectifier assembly according to claim 10, wherein the heat sink plates are substantially semicircular configured and adapted to be mounted within an automotive generator.

14. A rectifier assembly according to claim 10, and further comprising a plurality of diode mounting positioned on the lead integument for receiving field excitation diodes that interconnect lead integument connectors and diodes.

15. A rectifier assembly according to claim 14, wherein said diode mounting positions further comprises diode mounting clips that receive a diode in a snap fit connection.

16. A rectifier assembly according to claim 10, and further comprising a threaded output terminal mounted on the heat sink plate having the positive diodes and extending through the lead integument.

17. A rectifier assembly according to claim 10, and further comprising component attachment positions formed on said heat sink plates for receiving one of a side connector; stud terminal and/or spade terminal.

18. A rectifier assembly according to claim 17, wherein the one of a side connector, stud terminal and/or spade terminal and component attachment positions are configured for snap fit connections.

* * * * *